(12) United States Patent
Oda

(10) Patent No.: US 10,158,027 B2
(45) Date of Patent: Dec. 18, 2018

(54) SEMICONDUCTOR DEVICE AND METHOD FOR MANUFACTURING SAME

(71) Applicant: Sharp Kabushiki Kaisha, Sakai, Osaka (JP)

(72) Inventor: Akihiro Oda, Sakai (JP)

(73) Assignee: Sharp Kabushiki Kaisha, Sakai (JP)

(*) Notice: Subject to any disclaimer, the term of this patent is extended or adjusted under 35 U.S.C. 154(b) by 91 days.

(21) Appl. No.: 15/315,395

(22) PCT Filed: May 28, 2015

(86) PCT No.: PCT/JP2015/065419
§ 371 (c)(1),
(2) Date: Dec. 1, 2016

(87) PCT Pub. No.: WO2015/186602
PCT Pub. Date: Dec. 10, 2015

(65) Prior Publication Data
US 2017/0200827 A1    Jul. 13, 2017

(30) Foreign Application Priority Data
Jun. 3, 2014  (JP) .................................. 2014-114527

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 27/1259* (2013.01);
(Continued)

(58) Field of Classification Search
CPC ........................ H01L 27/1259; H01L 27/1225
(Continued)

(56) References Cited

U.S. PATENT DOCUMENTS 8,785,927 B2    7/2014  Ebata et al.
9,093,540 B2 *  7/2015  Lee ..................... H01L 29/7869
(Continued)

FOREIGN PATENT DOCUMENTS

JP   2003-086808 A   3/2003
JP   2008-040343 A   2/2008
(Continued)

*Primary Examiner* — Tuan Nguyen
(74) *Attorney, Agent, or Firm* — Keating & Bennett, LLP

(57) ABSTRACT

A semiconductor device (100) includes a thin film transistor (5) provided on a substrate and including a gate electrode (12), a gate insulating layer (20) in contact with the gate electrode, an oxide semiconductor layer (18) located so as to partially overlap the gate electrode with the gate insulating layer being located between the oxide semiconductor layer and the gate electrode, a source electrode (14), and a drain electrode (16). The oxide semiconductor layer (18) includes a gate facing region (18g) overlapping the gate electrode as seen in a direction of normal to the substrate; and offset regions (18os, 18od) provided adjacent to the gate facing region, the offset regions not overlapping the gate electrode, the source electrode or the drain electrode as seen in the direction of normal to the substrate. The gate facing region has a carrier concentration in the range of $1\times10^{17}/cm^3$ or greater and $1\times10^{19}/cm^3$ or less.

13 Claims, 11 Drawing Sheets

(51) Int. Cl.
*H01L 29/417* (2006.01)
*H01L 29/423* (2006.01)
*H01L 29/49* (2006.01)
*H01L 29/66* (2006.01)

(52) U.S. Cl.
CPC .. *H01L 29/41733* (2013.01); *H01L 29/42384* (2013.01); *H01L 29/4908* (2013.01); *H01L 29/66969* (2013.01); *H01L 29/78621* (2013.01)

(58) Field of Classification Search
USPC .............................................. 117/94; 438/104
See application file for complete search history.

(56) References Cited

U.S. PATENT DOCUMENTS

| | | | |
|---|---|---|---|
| 9,455,333 B2 * | 9/2016 | Lee | ................. H01L 29/7869 |
| 9,793,377 B2 * | 10/2017 | Lee | ................. H01L 29/7869 |
| 2003/0047785 A1 | 3/2003 | Kawasaki et al. | |
| 2008/0035920 A1 | 2/2008 | Takechi et al. | |
| 2009/0283763 A1 | 11/2009 | Park et al. | |
| 2011/0053322 A1 | 3/2011 | Sasaki et al. | |
| 2011/0069047 A1 | 3/2011 | Koyama et al. | |
| 2012/0138922 A1 | 6/2012 | Yamazaki et al. | |
| 2013/0320328 A1 * | 12/2013 | Lee | ................. H01L 29/7869 257/43 |
| 2015/0168758 A1 | 6/2015 | Nakata et al. | |
| 2015/0333154 A1 * | 11/2015 | Lee | ................. H01L 29/7869 438/158 |
| 2015/0333184 A1 * | 11/2015 | Lee | ................. H01L 29/7869 257/43 |

FOREIGN PATENT DOCUMENTS

| | | | | |
|---|---|---|---|---|
| JP | 2009-278115 A | | 11/2009 | |
| JP | 2009-290224 A | | 12/2009 | |
| JP | 2011-029630 A | | 2/2011 | |
| JP | 2011-091376 A | | 5/2011 | |
| JP | 2012-134475 A | | 7/2012 | |
| JP | 2013-175648 | * | 9/2013 | ........... H01L 21/336 |
| JP | 2013-175648 A | | 9/2013 | |
| JP | 2013-251526 | * | 12/2013 | ........... H01L 29/786 |
| JP | 2013-251526 A | | 12/2013 | |
| JP | 2014-017496 | * | 1/2014 | ........... H01L 29/786 |
| JP | 2014-017496 A | | 1/2014 | |
| JP | 2015-109315 A | | 6/2015 | |
| WO | 2013/065600 A1 | | 5/2013 | |
| WO | 2013/073619 A1 | | 5/2013 | |

* cited by examiner (a)

(b)

SEMICONDUCTOR DEVICE AND METHOD FOR MANUFACTURING SAME

TECHNICAL FIELD

The present invention relates to a semiconductor device using an oxide semiconductor and a method for producing the same.

BACKGROUND ART

An active matrix substrate usable for a liquid crystal display device or the like includes a switching element such as a thin film transistor (hereinafter, referred to as a "TFT") in each of pixels. As such a switching element, a TFT including an amorphous silicon film as an active layer (hereinafter, referred to as a "amorphous silicon TFT") or a TFT including a polycrystalline silicon film as an active layer (hereinafter, referred to as a "polycrystalline silicon TFT") is in wide use.

It has been attempted to use a material other than amorphous silicon or polycrystalline silicon as a material of an active layer of a TFT. For example, Patent Document 1 describes a liquid crystal display device including an oxide semiconductor film formed of InGaZnO (oxide containing indium, gallium and zinc) as an active layer of a TFT. Such a TFT is referred to as an "oxide semiconductor TFT".

An oxide semiconductor TFT is operable at a higher speed than an amorphous silicon TFT. An oxide semiconductor film is formed by a simpler process than a polycrystalline silicon film and therefore is applicable to a device requiring a large area size. For these reasons, use of an oxide semiconductor TFT for a display device or the like as a high performance active element producible at lower cost is now spreading.

Recently, a mobile device such as a smartphone, a tablet terminal or the like includes a compact high-definition liquid crystal display device. It is preferable to increase the pixel aperture ratio in order to realize bright display and extend the driving time period. The "pixel aperture ratio" refers to a ratio of size of an area usable for display (size of the area excluding non-display region including lines, TFT and the like) with respect to the area size of one pixel region. As the pixel aperture ratio is higher, the utilization factor of light from a backlight unit is higher. Such an increase in the pixel aperture ratio realizes bright display and decreases power consumption.

However, it is not easy to increase the pixel aperture ratio in a compact high-definition display device usable in a smartphone or the like because of the restriction on the minimum width of lines (process rule) or the like. Various technologies have been proposed in order to increase the pixel aperture ratio.

The pixel aperture ratio may be increased by use of, for example, the above-described oxide semiconductor TFT. A reason for this is the oxide semiconductor has a high mobility, and therefore, even a smaller oxide semiconductor TFT provides a level of performance higher than, or equal to, that of an amorphous silicon TFT. Usually, an area where a TFT is provided is blocked against light by a light blocking layer (e.g., by a gate electrode or a black matrix) because such an area is to be prevented from being irradiated with light or because such an area is difficult to be used for display. A decrease in the size of TFT increases the pixel aperture ratio by such a decrease.

It is also conceivable to locate a gate electrode and source and drain electrodes close to each other in order to increase the aperture ratio. For example, Patent Document 2 describes a structure including a TFT provided on a gate line to decrease the non-display region. A compact TFT realized in such a manner increases the size of the area usable for display with respect to the size of the pixel region, which increases the aperture ratio.

CITATION LIST

Patent Literature

Patent Document 1: Japanese Laid-Open Patent Publication No. 2003-86808
Patent Document 2: WO2013/073619
Patent Document 3: Japanese Laid-Open Patent Publication No. 2009-278115
Patent Document 4: Japanese Laid-Open Patent Publication No. 2008-40343

SUMMARY OF INVENTION

Technical Problem

In a TFT including a gate electrode and source/drain electrodes located close to each other, a parasitic capacitance is easily formed between the gate electrode and the source electrode and the gate electrode and the drain electrode. More specifically, in an area where the gate electrode (or gate line) and the source electrode overlap each other while having an insulating layer therebetween, a gate-source parasitic capacitance Cgs having a level determined by the overlapping area size and the thickness of the insulating layer is formed. In an area where the gate electrode and the drain line overlap each other while having an insulating layer therebetween, a gate-drain parasitic capacitance Cgd having a level determined by the overlapping area size and the thickness of the insulating layer is formed.

FIG. 11(a) and FIG. 11(b) each show a structure of a conventional oxide semiconductor TFT 90 of a bottom gate type. As shown in FIG. 11(a) and FIG. 11(b), the oxide semiconductor TFT 90 includes a substrate 91, a gate electrode 92, a gate insulating layer covering the gate electrode 92, an island-shaped oxide semiconductor layer 94 provided on the gate insulating layer 93 so as to overlap the gate electrode 92, and a source electrode 95 and a drain electrode 96 respectively connected with two ends of the island-shaped oxide semiconductor layer 94. The layers 93 and 94 and the electrodes 92, 95 and 96 are provided on the substrate 91. The source electrode 95 and the drain electrode 96 are located to be away from each other, and a portion of the oxide semiconductor layer 94 that is held between the source electrode 95 and the drain electrode 96 acts as a channel 94C of the oxide semiconductor TFT 90.

In the oxide semiconductor TFT 90, the gate electrode 92 is provided to be sufficiently large to overlap the entirety of the oxide semiconductor layer 94. A reason for this is that the oxide semiconductor layer 94 has a relatively high electrical resistance, and in order to provide a high ON current, it is preferable to activate the entirety of the oxide semiconductor layer 94 by an ON voltage to be applied to the gate electrode 92.

However, such a structure results in a size of an area 95A where the gate electrode 92 and the source electrode 95 overlap each other and a size of an area 96A where the gate electrode 92 and the drain electrode 96 overlap each other being relatively large. As a result, the parasitic capacitances Cgs and Cgd formed in the oxide semiconductor TFT 90 via the gate insulating layer 93 or the like have a high level.

The parasitic capacitances Cgs and Cgd formed between the gate electrode 92 and the source/drain electrodes 95 and 96 decrease the operating speed of the oxide semiconductor TFT 90. In the case where the parasitic capacitances Cgs and Cgd have a high level, the time period required to apply a desired voltage to a liquid crystal layer after the oxide semiconductor TFT 90 is turned on is long, and thus a high-speed response may not occasionally be provided.

It is known that in the case where a TFT substrate is used in a liquid crystal display device, when the TFT is switched from an ON state to an OFF state, the pixel voltage is decreased by the gate-drain capacitance Cgd. Such a decrease in the pixel voltage is called a "field through voltage", and the level thereof is often generally proportional to the level of the gate-drain parasitic capacitance Cgd (varying in accordance with the size of the area where the gate electrode and the drain electrode overlap each other).

In the case where the field through voltage is high, when, for example, polarity inversion driving is performed, a positive voltage actually applied to the pixel and a negative voltage actually applied are different in the level (absolute value). This may cause flicker along with the polarity inversion, or may require application of a relatively high offset voltage in order to suppress the flicker.

The oxide semiconductor TFT 90 has another problem that since the area 95A where the gate electrode 92 and the source electrode 95 overlap each other and the area 96A where the gate electrode 92 and the drain electrode 96 overlap each other need to be relatively large, it is difficult to decrease the size of the TFT 90. In addition, the areas 95A and 96A are not usable as a display region, which decreases the pixel aperture ratio.

It is conceivable to locate the gate electrode and the source/drain electrodes to be away from each other in order to decrease the size of the area where the gate electrode and the source electrode overlap each other and the size of the area where the gate electrode and the drain electrode overlap each other. Patent Document 3 discloses a structure of a top gate-type transistor in which a spacer (hereinafter, referred to as a "side wall") formed of an insulating material is provided on a side surface of the gate electrode. In the TFT described in Patent Document 3, a conductive region is formed in a semiconductor layer in a self-alignment manner by use of the gate electrode and the side wall as a mask, and thus an offset region is formed between the channel region just below the gate electrode and the conductive region. Such a structure including the offset region easily decreases the level of parasitic capacitances Cgs and Cgd.

However, in the case where the drain electrode and the gate electrode are away from each other, there are problems that the operating speed of the TFT is decreased and that it is difficult to provide a high ON current. Especially, an oxide semiconductor TFT has a superb off-leak characteristic but often has a high resistance of the oxide semiconductor layer. Therefore, in the case where the drain electrode and the gate electrode are away from each other, a sufficiently high ON characteristic may not be provided.

With the structure of TFT described in Patent Document 3, areas covered with the source electrode and the drain electrode have a large area size. This causes a problem that it is difficult to realize a high aperture ratio. In addition, the side wall needs to be formed, which complicates the production process and thus decreases the throughput of the products.

The present invention made in light of the above-described problems has an object of providing a semiconductor device including an oxide semiconductor TFT decreasing the level of parasitic capacitances and providing high operating characteristics, and a method for producing the same.

Solution to Problem

A semiconductor device in an embodiment according to the present invention includes a substrate; and a thin film transistor provided on the substrate, the thin film transistor including a gate electrode, a gate insulating layer in contact with the gate electrode, an oxide semiconductor layer located so as to partially overlap the gate electrode with the gate insulating layer being located between the oxide semiconductor layer and the gate electrode, and a source electrode and a drain electrode electrically connected with the oxide semiconductor layer. The source electrode and the drain electrode are located to be away from the gate electrode as seen in a direction of normal to the substrate. The oxide semiconductor layer includes a gate facing region overlapping the gate electrode as seen in the direction of normal to the substrate; and at least one offset region provided adjacent to the gate facing region, the at least one offset region not overlapping the gate electrode, the source electrode or the drain electrode as seen in the direction of normal to the substrate. The gate facing region has a carrier concentration in a range of $1 \times 10^{17}/cm^3$ or greater and $1 \times 10^{19}/cm^3$ or less.

In an embodiment, the at least one offset region has a carrier concentration of $1 \times 10^{17}/cm^3$ or greater.

In an embodiment, the semiconductor device includes a source connecting region and a drain connecting region provided adjacent to the offset region and in contact with the source electrode and the drain electrode; and the source connecting region and the drain connecting region each have a carrier concentration of $1 \times 10^{17}/cm^3$ or greater.

In an embodiment, the at least one offset region has a carrier concentration higher than the carrier concentration of the gate facing region.

In an embodiment, the thin film transistor is of a depression type.

In an embodiment, the gate electrode is provided as a lower layer with respect to the oxide semiconductor layer with the gate insulating layer being located between the gate electrode and the oxide semiconductor layer.

In an embodiment, the semiconductor device further includes an etch stop layer provided as an upper layer with respect to the oxide semiconductor layer so as to at least partially overlap the gate facing region of the oxide semiconductor layer.

In an embodiment, the gate electrode is provided as an upper layer with respect to the oxide semiconductor layer with the gate insulating layer being located between the gate electrode and the oxide semiconductor layer.

In an embodiment, the semiconductor device includes a plurality of pixel regions arrayed in a matrix having a row direction and a column direction, a plurality of gate bus lines each extending generally parallel to the row direction, and a plurality of source bus lines each extending generally parallel to the column direction; the pixel regions, the gate bus lines and the source bus lines being provided on the substrate. The plurality of pixel regions each include the thin film transistor; and a pixel electrode connected with the thin film transistor. The at least one offset region of the oxide semiconductor layer extends from the source electrode included in the source bus line to the gate bus line, and the drain electrode is located on a side opposite to the source electrode with the gate bus line being located between the drain electrode and the source electrode.

In an embodiment, the oxide semiconductor layer contains at least one metal element among In, Ga and Zn.

In an embodiment, the oxide semiconductor layer includes a crystalline portion.

A method for producing a semiconductor device in an embodiment according to the present invention includes a step of preparing a substrate; and a step of forming a thin film transistor on the substrate, the step of forming a thin film transistor including a step of forming a gate electrode, a step of forming a gate insulating layer in contact with the gate electrode, a step of forming an oxide semiconductor layer so as to partially overlap the gate electrode with the gate insulating layer being located between the oxide semiconductor layer and the gate electrode, and a step of forming a source electrode and a drain electrode electrically connected with the oxide semiconductor layer. The step of forming the thin film transistor further includes a step of, after forming the oxide semiconductor layer, changing a carrier concentration of the oxide semiconductor layer to adjust the carrier concentration of a gate facing region in the oxide semiconductor layer to be in a range of $1 \times 10^{17}/cm^3$ or greater and $1 \times 10^{19}/cm^3$ or less.

Advantageous Effects of Invention

An embodiment of the present invention provides a semiconductor device including a TFT that decreases the level of the parasitic capacitances and is operable at a higher speed, and a method for producing the same.

BRIEF DESCRIPTION OF DRAWINGS

FIG. 1(*a*) is a plan view and FIG. 1(*b*) is a cross-sectional view.

FIG. 2(*b*) is a graph showing curve X2 representing the relationship between the carrier concentration of an oxide semiconductor layer and the on/off ratio in the TFT in embodiment 1 according to the present invention.

FIG. 3(*a*') and FIG. 3(*b*') are plan views respectively corresponding to FIG. 3(*a*) and FIG. 3(*b*).

FIG. 4(*b*) is a plan view showing an example of structure of a TFT substrate in a reference example.

FIG. 5(*a*) is a plan view and FIG. 5(*b*) is a cross-sectional view.

FIG. 6(*a*') and FIG. 6(*c*') are plan views respectively corresponding to FIG. 6(*a*) and FIG. 6(*c*).

FIG. 8(*a*) is a plan view and FIG. 8(*b*) is a cross-sectional view.

FIG. 9(*b*') and FIG. 9(*d*') are plan views respectively corresponding to FIG. 9(*b*) and FIG. 9(*d*).

FIG. 11(*a*) is a plan view and FIG. 11(*b*) is a cross-sectional view.

DESCRIPTION OF EMBODIMENTS

Hereinafter, a TFT substrate will be described as a semiconductor device in each of embodiments according to the present invention. The present invention is not limited to any of the following embodiments. In this specification, the "semiconductor device" refers to any device including a TFT, and encompasses a wide range of items such as a TFT substrate, a display device including a TFT substrate, and the like.

Embodiment 1

Figure 1:
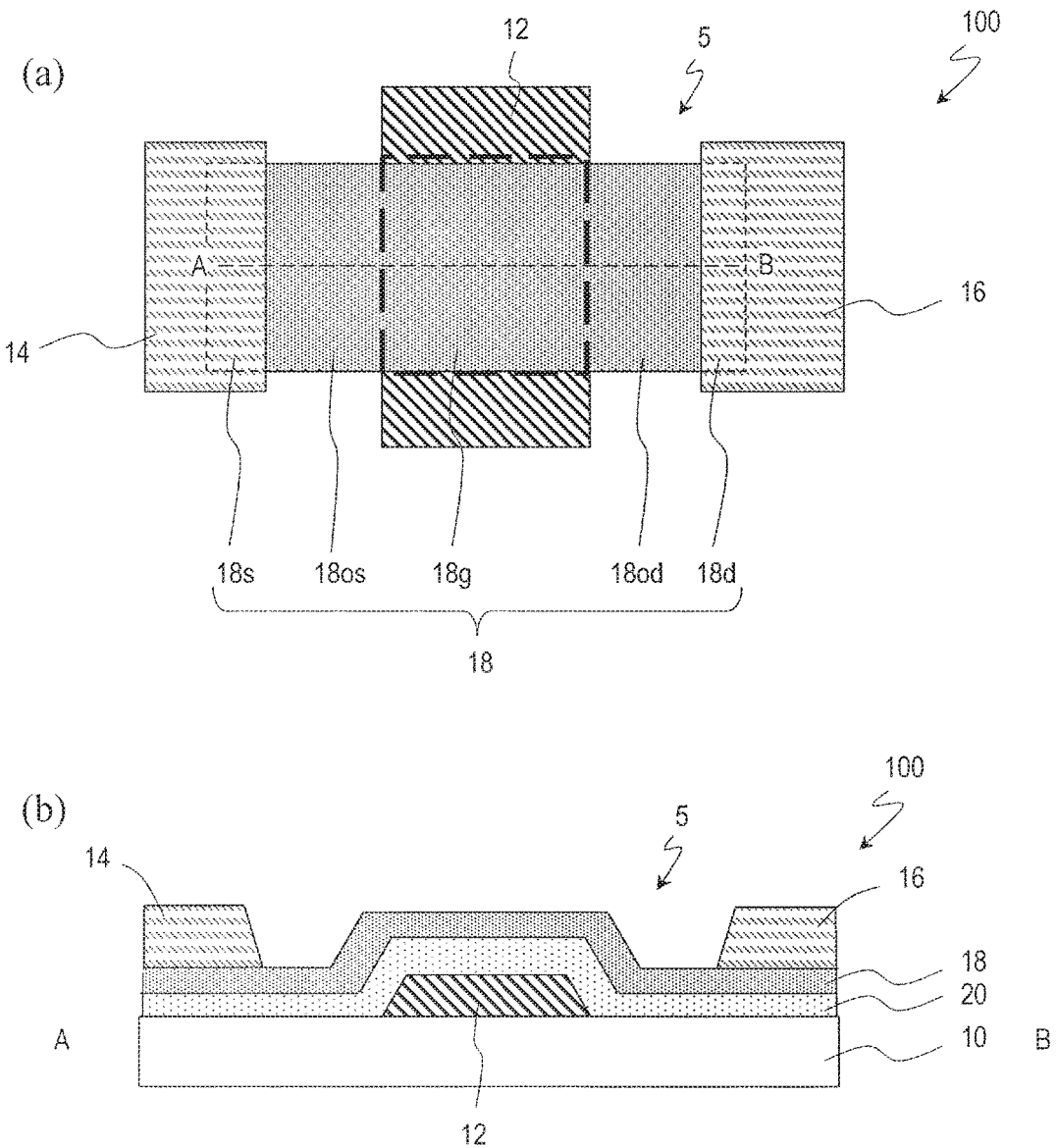
FIG. 1 shows a TFT substrate in embodiment 1 according to the present invention.

FIG. 1(*a*) is a plan view showing a semiconductor device (TFT substrate) 100 in embodiment 1. FIG. 1(*b*) is a cross-sectional view of the TFT substrate 100 taken along line A-B of FIG. 1(*a*).

Figure 4:
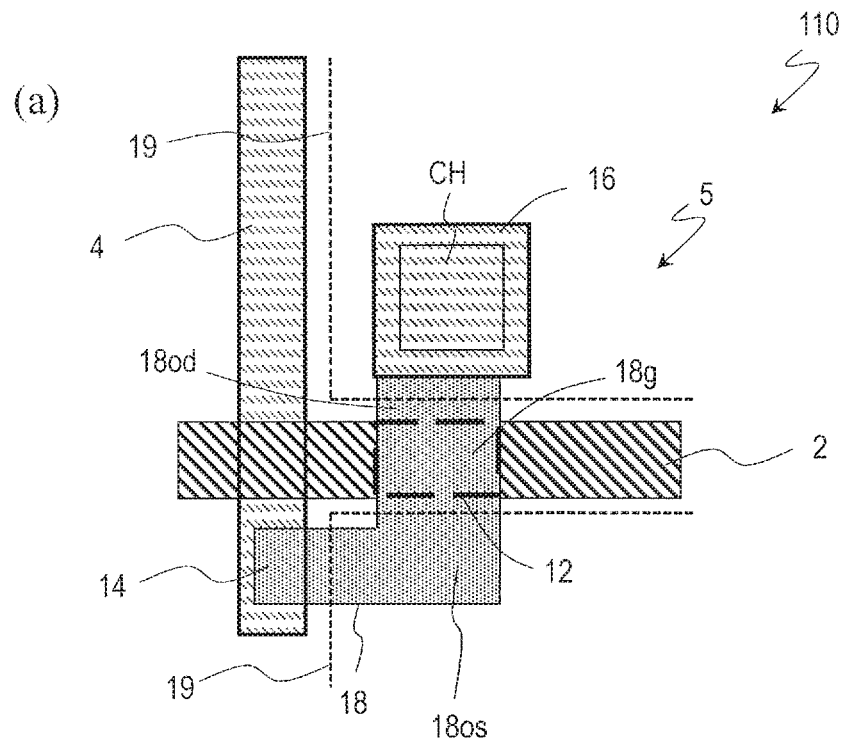
FIG. 4(*a*) is a plan view showing an example of structure in the case where the TFT substrate in embodiment 1 is used for a liquid crystal display device.
Figure 4:
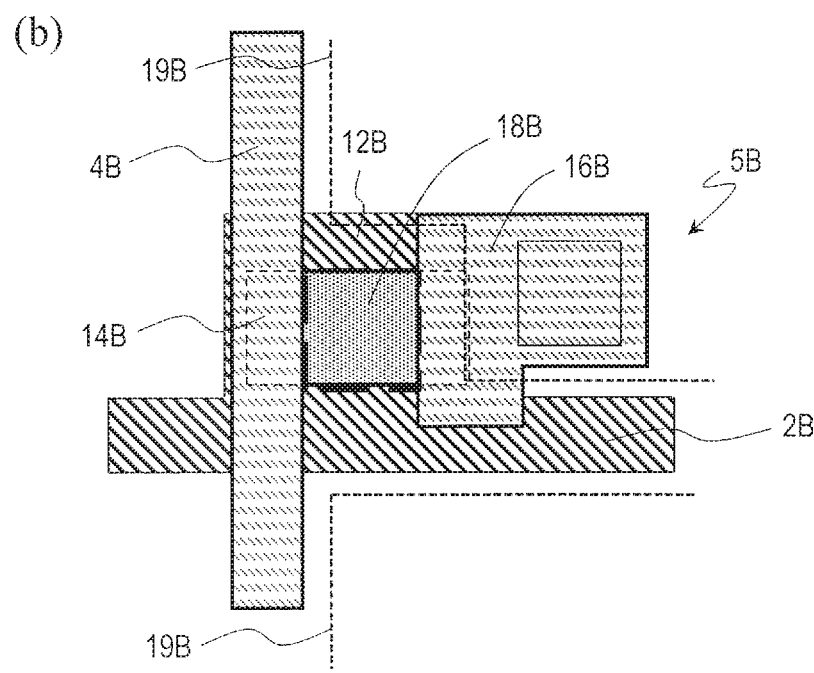

The TFT substrate 100 is usable for, for example, a liquid crystal display device providing display in a VA (Vertical Alignment) mode. The TFT substrate 100 may be used for a liquid crystal display device providing display in, for example, a transverse electric field mode such as an IPS (In-Plane Switching) mode, an FFS (Fringe Field Switching) mode or the like. The TFT substrate 100 may be used for an organic EL display device including a selection transistor. A more specific structure of a liquid crystal display device including the TFT substrate 100 will be described below with reference to FIG. 4. In FIG. 4, the TFT substrate 100 will be shown as a TFT substrate 110.

As shown in FIG. 1(*a*) and FIG. 1(*b*), the TFT substrate 100 includes a TFT 5 provided on a substrate 10. FIG. 1(*a*) and FIG. 1(*b*) each show one TFT 5. Alternatively, the TFT substrate 100 may include a plurality of TFTs 5, needless to say. As described below, the TFT substrate 100, in the case of being used in a liquid crystal display device, includes a plurality of TFTs 5 respectively provided for a plurality of pixels. In the case where a driving circuit (gate driver, etc.) is provided in a monolithic manner outer to a display region, the TFT substrate 100 may include a plurality of TFTs 5 forming the driving circuit.

In this embodiment, the TFT 5 has a bottom gate-type structure, and includes a gate electrode 12 provided on the substrate 10, which is insulating, a gate insulating layer 20 covering the gate electrode 12, and a typically island-shaped oxide semiconductor layer 18 provided on the gate insulating layer 20.

The oxide semiconductor layer 18 includes a gate facing region 18*g* overlapping the gate electrode 12 as seen in a direction of normal to the substrate (the gate facing region 18*g* may be referred to as an "activation region" or a "channel region") and a pair of outer regions outer to the gate facing region 18g on two sides (on a source side and a drain side). The pair of outer regions are included in the oxide semiconductor layer 18 and do not overlap the gate electrode 12.

A source electrode 14 and a drain electrode 16 are respectively connected with the pair of outer regions located outer to, and on the two sides of, the gate facing region 18g. The source electrode 14 and the drain electrode 16 are located to be away from the gate electrode 12 as seen in the direction of normal to the substrate. Herein, a region of the oxide semiconductor layer 18 that overlaps (contacts) the source electrode 14 will be referred to as a "source connecting region 18s", and a region of the oxide semiconductor layer 18 that overlaps (contacts) the drain electrode 16 will be referred to as a "drain connecting region 18d".

The oxide semiconductor layer 18 includes a region 18os that is provided between the gate facing region 18g and the source connecting region 18s and does not overlap the gate electrode 12 or the source electrode 14. The oxide semiconductor layer 18 includes a region 18od that is provided between the gate facing region 18g and the drain connecting region 18d and does not overlap the gate electrode 12 or the drain electrode 16. Hereinafter, these regions will be respectively referred to as a "source-side offset region 18os" and a "drain-side offset region 18od" (or will be collectively referred to as "offset regions 18os and 18od").

In the TFT 5 in this embodiment, at least the gate facing region 18g and the offset regions 18os and 18od of the oxide semiconductor layer 18 have a substantially equal carrier concentration. As described below regarding a production method, the gate facing region 18g and the offset regions 18os and 18od are formed of the same oxide semiconductor film and are subjected to the same carrier concentration control process (e.g., plasma processing). Hereinafter, in this specification, the gate facing region 18g and the offset regions 18os and 18od may be collectively referred to as a "channel formation region" as a semiconductor region located between the source electrode 14 and the drain electrode 16.

In the case where a certain type of metal material is used to form the source electrode 14 and the drain electrode 16, the carrier concentration of the offset regions 18os and 18od may be made higher in the vicinity of the source electrode 14 and the drain electrode 16. A reason for this is that hydrogen diffused from the source electrode 14 and the drain electrode 16 causes a reduction action to the offset regions 18os and 18od. In this specification, the regions formed of the concentration oxide semiconductor film and subjected to substantially the same carrier concentration control process may be expressed as "having a substantially equal carrier concentration". This may encompass the case where the carrier concentration of the offset regions 18os and 18od is not exactly equal to as that of the gate facing region 18g.

The oxide semiconductor layer 18 may contain, for example, at least one metal element among In, Ga and Zn. In this embodiment, the oxide semiconductor layer 18 contains, for example, an In—Ga—Zn—O-based oxide. The In—Ga—Zn—O-based oxide is an oxide containing three components of In (indium), Ga (gallium) and Zn (zinc). There is no specific limitation on the ratio among In, Ga and Zn. For example, In:Ga:Zn=2:2:1, In:Ga:Zn=1:1:1, In:Ga:Zn=1:1:2, or the like. The oxide semiconductor layer 18 may be formed of an oxide semiconductor film containing an In—Ga—Zn—O based semiconductor. The In—Ga—Zn—O based semiconductor may be amorphous or crystalline. A preferable crystalline In—Ga—Zn—O based semiconductor has a c axis aligned generally perpendicularly to the layer surface. A crystalline structure of the crystalline In—Ga—Zn—O based semiconductor is disclosed in, for example, Japanese Laid-Open Patent Publication No. 2012-134475. The entirety of the disclosure of Japanese Laid-Open Patent Publication No. 2012-134475 is incorporated herein by reference. A TFT including an In—Ga—Zn—O based semiconductor layer has a high mobility (20 times as high as that of an a-Si TFT) and a low leak current (less than 1/100 of that of an a-Si TFT), and thus is preferably usable as a driving TFT and a pixel TFT.

The oxide semiconductor layer 18 may contain another oxide instead of the In—Ga—Zn—O-based oxide. The oxide semiconductor layer 18 may contain, for example, a Zn—O-based (ZnO) oxide, an In—Zn—O-based (IZO) oxide, an Zn—Ti—O-based (ZTO) oxide, a Cd—Ge—O-based oxide, a Cd—Pb—O-based oxide, an In—Sn—Zn—O-based oxide (e.g., $In_2O_3$—$SnO_2$—ZnO), an In—Ga—Sn—O-based oxide, or the like.

The gate facing region 18g and the offset regions 18os and 18od formed of, for example, an In—Ga—Zn—O-based semiconductor described above are formed such that the source electrode 14 and the drain electrode 16 are conductive to each other during an ON period of the TFT 5 (time period in which the gate electrode 12 is supplied with an ON voltage Vgh). The gate facing region 18g is a main region that does not exhibit an active state while being supplied with an OFF voltage Vgl and exhibits an active state while being supplied with an ON voltage Vgh. The gate facing region 18g has a conductivity thereof significantly increased when the TFT is in an ON state. By contrast, the offset regions 18os and 18od does not have a conductivity thereof generally changed while being supplied with an OFF voltage Vgl or while being supplied with an ON voltage Vgh. As described below, since the offset regions 18os and 18od originally have a high carrier concentration, the conductivity of the offset regions 18os and 18od is high regardless of whether the TFT is in an ON state or in an OFF state. Therefore, the offset regions 18os and 18od act as a source-drain channel together with the gate facing region 18g while the TFT is in an ON state. A portion of the offset regions 18os and 18od that is in the vicinity of the gate electrode 12 may have the conductivity thereof increased while being supplied with an ON voltage Vgh.

In order to provide a sufficiently high ON current, the carrier concentration of the gate facing region 18g and the offset regions 18os and 18od is set to be relatively high. Specifically, the carrier concentration of the gate facing region 18g and the offset regions 18os and 18od is set to be in the range of $1 \times 10^{17}/cm^3$ or greater and $1 \times 10^{19}/cm^3$ or less.

The carrier concentration is set to be in the above-described range for the following reasons. If the carrier concentration is less than $1 \times 10^{17}/cm^3$, the oxide semiconductor layer has an excessively high resistance and therefore it is difficult to increase the ON current. If the carrier concentration exceeds $1 \times 10^{19}/cm^3$, the oxide semiconductor layer has a low resistance but also has a low threshold voltage Vth. Therefore, a sufficiently high OFF current is not provided in the voltage range in which the TFT is to be driven, which increases the off-leak current. For these reasons, when the carrier concentration is less than $1 \times 10^{17}/cm^3$ or exceeds $1 \times 10^{19}/cm^3$, the on/off ratio of the TFT (ratio of the drain current value when the TFT is ON/the drain current value when the TFT is OFF) is decreased.

A more preferable range of the carrier concentration of the above-described regions is in the range of $3 \times 10^{17}/cm^3$ or greater and $3\times10^{18}/cm^3$ or less. Setting the carrier concentration of the oxide semiconductor layer to be in such an appropriate range in this manner suppresses the off-leak current while providing a sufficiently high ON current. Thus, a more preferable on/off ratio (e.g., 6.7 or greater) is realized.

As described below, there may be a case where the carrier concentration of, especially, the offset regions 18os and 18od is not uniform and a concentration profile that is not uniform in a channel length direction is formed. In this case, the carrier concentration may exceed $1\times10^{19}/cm^3$ in a part of the offset regions 18os and 18od.

The carrier concentration of the oxide semiconductor layer may be measured by use of, for example, a hall element. More specifically, a hall element including an oxide semiconductor layer formed by substantially the same production process as that of the oxide semiconductor layer included a TFT is produced, and the carrier concentration of the oxide semiconductor layer is measured based on a characteristic of the hall element. The relationship between a characteristic (e.g., on/off ratio) of the TFT including the oxide semiconductor layer produced by substantially the same process and the carrier concentration of the hall element is found. Thus, the relationship between the carrier concentration of the oxide semiconductor layer included in the TFT and the TFT characteristic is found.

Now, a channel width and a channel length of the TFT 5 will be described. Regarding the TFT 5, the channel width is equal to a width of the gate facing region 18g (in this example, a width of the oxide semiconductor layer 18) defined in a direction perpendicular to the source-drain direction (channel length direction), and is, for example, 2 μm to 10 μm. The channel length is equivalent to a length of the gate facing region 18g (in this example, equivalent to a width of the gate electrode 12) defined in a direction parallel to the source-drain direction (channel length direction), and is, for example, 2 μm to 10 μm. The offset regions 18os and 18od each have a length in the channel length direction of, for example, 0.5 μm to 15 μm. In order to realize a high on/off ratio, it is especially preferable that the length of each of the offset regions 18os and 18od is within three times as great as the channel width.

In the TFT 5 described above, the gate electrode 12 is away from each of the source electrode 14 and the drain electrode 16. Therefore, neither the source-gate parasitic capacitance Cgs nor the drain-gate parasitic capacitance Cgd is formed. This increases the operating speed of the TFT and minimizes the field through voltage.

Since the carrier concentration of the channel formation region of the oxide semiconductor layer is controlled to be $1\times10^{17}/cm^3$ to $1\times10^{19}/cm^3$, the source electrode and the drain electrode are appropriately conductive to each other while the TFT is in an ON state. For example, it has been confirmed that even in the case where the length of each of the offset regions 18os and 18od is 15 μm and the channel width is 5 μm, a sufficiently high on/off ratio is provided.

In this embodiment, the TFT 5 has a bottom gate-type structure, and thus the gate electrode 12 acts as a light blocking layer to prevent the activation region (gate facing region 18g) of the oxide semiconductor layer 18 from being irradiated with light. This provides an advantage that a light blocking layer does not need to be provided additionally in order to stabilize the TFT characteristics.

In the TFT 5, the carrier concentration of the channel formation region is high, and thus the TFT 5 is typically of a depression type. A "depression-type TFT" refers to a TFT in which a drain current Id has a substantive level (at which an inversion layer is formed) when the gate-source voltage Vgs (in this example, gate voltage Vg) is 0 V. In the case where an n-type TFT including an In—Ga—Zn—O-based semiconductor layer described above as an active layer is of a depression type, the voltage Vg1 to be applied to the gate electrode 12 in an OFF period is usually controlled to be a negative voltage (having a level of, for example, −10 V to −15 V).

Figure 2:
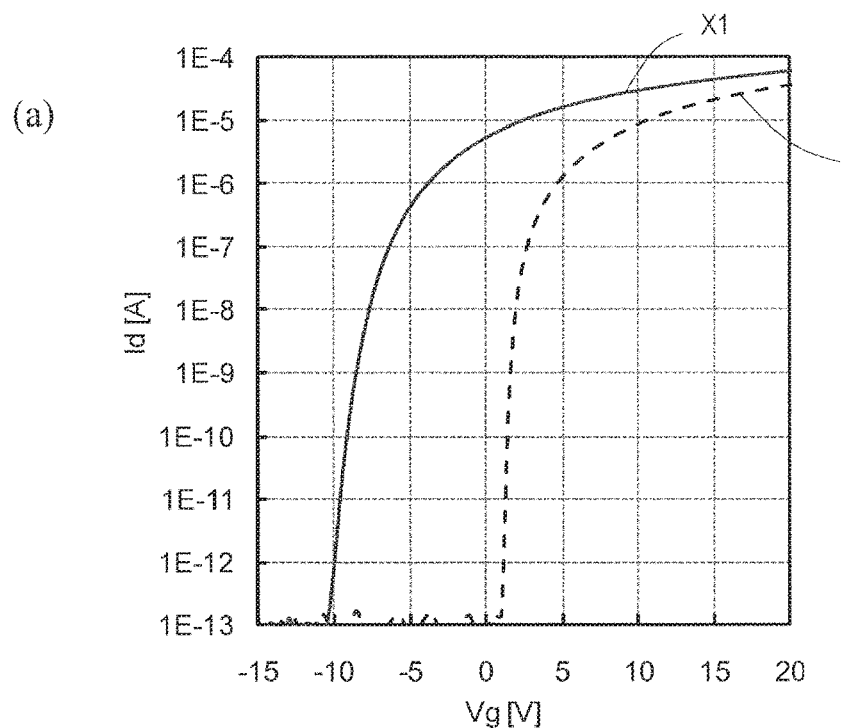
FIG. 2(*a*) is a graph showing curve X1 (solid line) representing the Vg-Id characteristic of the TFT in embodiment 1 according to the present invention and curve Y1 (dashed line) representing the Vg-Id characteristic of a TFT in a reference example.
Figure 2:
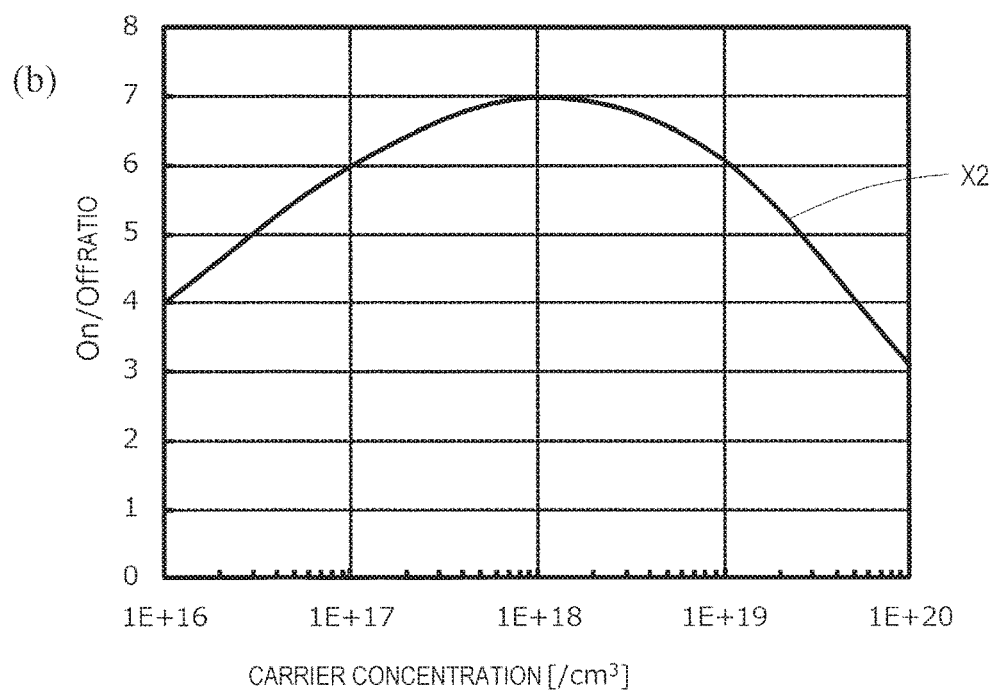

FIG. 2(a) is a graph showing the relationship between the gate voltage Vg [V] and the drain current Id [A] of the TFT 5 and of a TFT in a reference example in which the carrier concentration of the oxide semiconductor layer is set to be relatively low (less than $1\times10^{17}/cm^3$). As can be seen from FIG. 2(a), curve X1 (solid line) representing the TFT 5 shows that when the gate voltage Vg is 0 V, the drain current Id is relatively high and that the TFT is in a state close to an ON state. This is because the carrier concentration of the channel is relatively high. By contrast, curve Y1 (dashed line) representing the TFT in the reference example (in which the carrier concentration is not specifically controlled) shows that when the gate voltage Vg is 0 V, the drain current Id is also approximately 0 A and that the TFT is in an OFF state (enhancement type).

As shown by curve X2 in FIG. 2(b), the carrier concentration of the channel in the TFT 5 in this embodiment is set to be in the range of $1\times10^{17}/cm^3$ or greater and $1\times10^{19}/cm^3$ or less. Therefore, even though the TFT 5 includes the offset regions 18os and 18od in order to decrease the level of the parasitic capacitances, the on/off ratio is sufficiently high, more specifically, 6 or greater.

The TFT 5 described above is of a top contact type, in which the source electrode 14 and the drain electrode 16 are formed as upper layers with respect to the oxide semiconductor layer 18. The TFT in this embodiment may be of a bottom contact type, in which the oxide semiconductor layer 18 is provided as an upper layer with respect to the source electrode 14 and the drain electrode 16. In this case also, the source electrode 14 and the drain electrode 16 are located to be away from the gate electrode 12 as seen in the direction of normal to the substrate, and the oxide semiconductor layer 18 includes an area overlapping the gate electrode 12 and an area (offset region) not overlapping the gate electrode 12, the source electrode 14 or the drain electrode 16.

Figure 3:
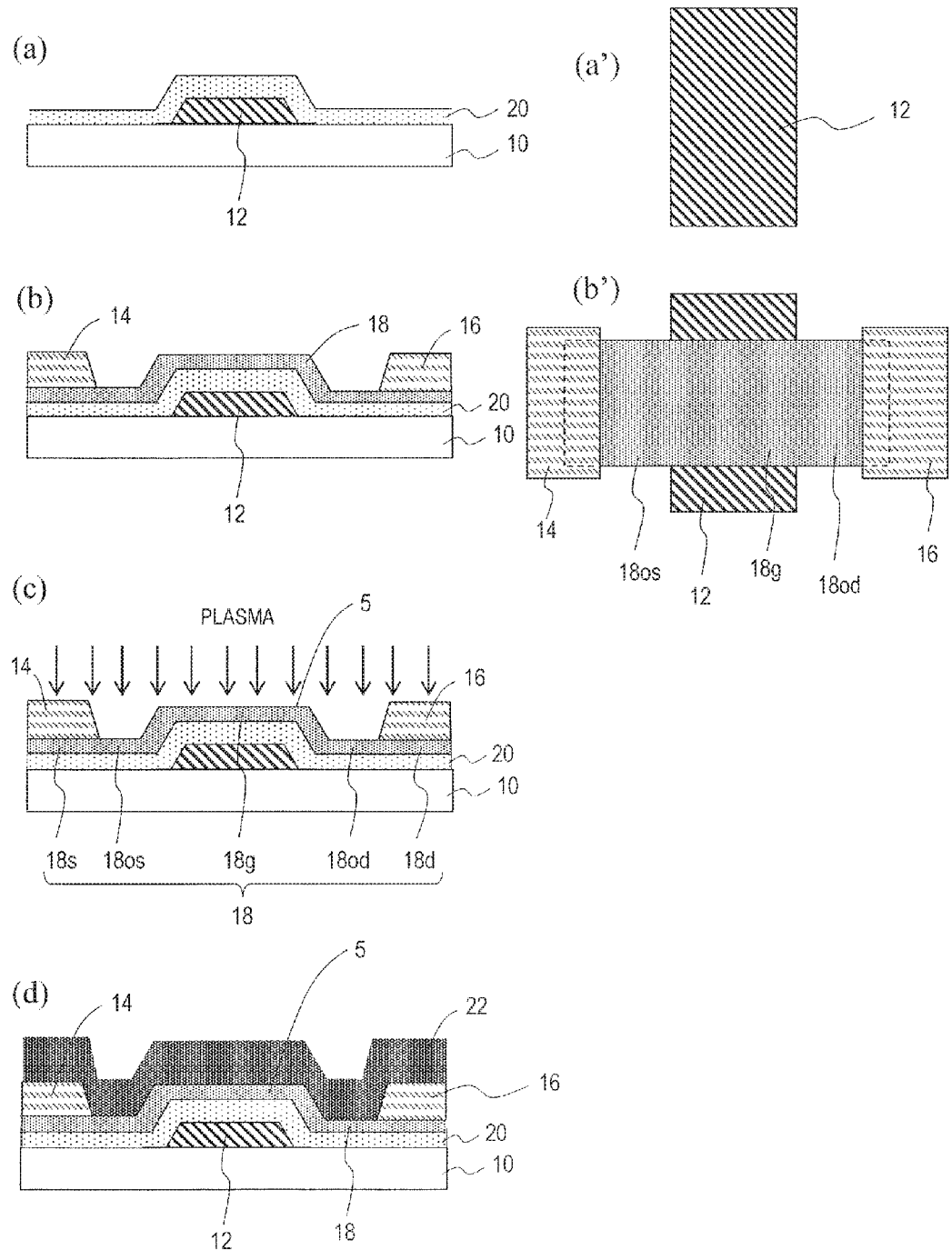
FIG. 3(*a*) through FIG. 3(*d*) are cross-sectional views showing a method for producing the TFT substrate in embodiment 1 according to the present invention.

Hereinafter, with reference to FIG. 3(a) through FIG. 3(d), FIG. 3(a') and FIG. 3(b'), an example of method for producing the TFT substrate 100 in this embodiment will be described. FIG. 3(a') and FIG. 3(b') are plan views corresponding to FIG. 3(a) and FIG. 3(b).

First, a metal film for the gate electrode is formed on the substrate 10 shown in FIG. 3(a), which is transparent and insulating and is formed of glass or a plastic material. The metal film for the gate electrode may be appropriately formed of a film containing a metal material such as Mo, Ti, Al, Ta, Cr, Au, W, Cu or the like or an alloy thereof. The metal film for the gate electrode may be formed to have a thickness of, for example, 100 nm to 500 nm by use of a sputtering device. The metal film for the gate electrode may have a stack structure (e.g., Ti/Al/Ti). Then, the metal film for the gate electrode is patterned by a known photolithography method, and is etched by a known dry or wet method. As a result, as shown in FIG. 3(a'), a gate line layer including the gate electrode 12 and a gate bus line (not shown) is formed.

Next, as shown in FIG. 3(a), the gate insulating layer 20 is formed so as to cover the gate line layer including the gate electrode 12. The gate insulating layer 20 may be formed of, for example, silicon oxide ($SiO_2$) or silicon nitride ($SiN_x$).

The gate insulating layer 20 may be formed to have a thickness of 300 nm to 400 nm at a temperature of 300° C. to 400° C. by use of a plasma CVD device.

Next, as shown in FIG. 3(*b*) and FIG. 3(*b'*), an oxide semiconductor film is formed on the gate insulating layer 20 to have a thickness of 20 nm to 100 nm at a temperature of 200° C. to 400° C. by use of, for example, sputtering, and the oxide semiconductor film is patterned by photolithography to form the oxide semiconductor layer 18, which is typically island-shaped. The oxide semiconductor film may be formed of an application process.

The oxide semiconductor layer 18 is provided such that a part thereof overlaps the gate electrode 12 with the gate insulating layer 20 being provided therebetween and a part thereof does not overlap the gate electrode 12. The oxide semiconductor film may be formed of, for example, an In—Ga—Zn—O-based semiconductor. As described above, the oxide semiconductor film may be formed of any of various other oxide semiconductors such as IZO, ZnO or the like.

Then, a metal film (that may appropriately contain a metal material such as Mo, Ti, Al, Ta, Cr, Au, W, Cu or the like or an alloy thereof) for forming a source and drain layer including the source electrode and the drain electrode is formed to have a thickness of 100 nm to 500 nm by a use of a sputtering device, and is patterned by photolithography to form the source and drain layer including the source electrode 14 and the drain electrode 16. The metal film may have a stack structure (e.g., Ti/Au/Ti).

In the above-described patterning step, as shown in FIG. 3(*b'*), the source electrode 14 and the drain electrode 16 are each formed so as to contact a portion (end) of the part of the oxide semiconductor layer 18 that does not overlap the gate electrode 12. The source electrode 14 and the drain electrode 16 are each located at a position away from the gate electrode 12 by a predetermined distance. With this structure, the source-side offset region 18*os* not overlapping the gate electrode 12 or the source electrode 14 and the drain-side offset region 18*od* not overlapping the gate electrode 12 or the drain electrode 16 are formed in the oxide semiconductor layer 18 on two sides of the gate facing region 18*g*, which is a part of the oxide semiconductor layer 18 and overlaps the gate electrode 12.

In the example shown in the figures, the source electrode 14 and the drain electrode 16 cover the entirety of edges, in a lateral direction, of the oxide semiconductor layer 18. The source electrode 14 and the drain electrode 16 are not limited to being provided in such a manner. It is sufficient that the source electrode 14 and the drain electrode 16 are electrically connected with the oxide semiconductor layer 18. For example, parts of the edges, in the lateral direction, of the oxide semiconductor layer 18 may contact edges of the source electrode 14 and the drain electrode 16.

Then, as shown in FIG. 3(*c*), the plasma processing is performed in order to control the carrier concentration of the oxide semiconductor layer 18. The plasma processing may be realized by, for example, plasma irradiation performed in a plasma CVD device by use of reducing gas such as hydrogen gas or the like, or by use of argon gas or the like. As a result of the plasma processing, the carrier concentration of the oxide semiconductor layer 18, especially, of the gate facing region 18*g* and the offset regions 18*os* and 18*od* of the oxide semiconductor layer 18 is controlled to be in the range of $1 \times 10^{17}/cm^3$ or greater and $1 \times 10^{19}/cm^3$ or less.

The plasma processing may be performed for a time period of, for example, 30 to 200 seconds while, for example, the flow rate of hydrogen gas is set to 100 to 1000 sccm, the substrate temperature is set to 200 to 300° C., the RF power is set to 100 to 200 W, and the pressure is set to 50 to 200 Pa. After the plasma processing, annealing is performed in the atmosphere at a temperature of 200 to 300° C. for 0.5 to 2 hours. Thus, the carrier concentration of the oxide semiconductor layer 18 is set to be in the above-described range. In the case where the plasma processing is not performed, the carrier concentration of the oxide semiconductor layer is usually $10 \times 10^{16}/cm^3$ or less.

Instead of the plasma processing described above, implantation of hydrogen ions may be performed by use of an ion doping device to control the carrier concentration of the gate facing region 18*g* and the offset regions 18*os* and 18*od* to be in the range of $1 \times 10^{17}/cm^3$ to $1 \times 10^{19}/cm^3$.

Patent Document 4 describes a specific process for decreasing the resistance of an oxide semiconductor (plasma processing) and a mechanism by which the electric resistance of the oxide semiconductor is decreased by the process. In this embodiment also, the process described in Patent Document 4 is usable in order to control the carrier concentration. The entirety of the disclosure of Patent Document 4 is incorporated herein by reference.

The oxide semiconductor TFT 5 including the oxide semiconductor layer 18, which includes the gate facing region 18*g* and the offset regions 18*os* and 18*od*, as an active layer is produced by the above-described steps.

Then, as shown in FIG. 3(*d*), a passivation layer 22 as a protective layer is formed so as to cover the oxide semiconductor TFT 5. In order to form the passivation layer 22, for example, a silicon oxide ($SiO_2$) film or a silicon nitride ($SiN_x$) film is formed to have a thickness of 200 nm to 500 nm at a temperature of 200° C. to 300° C. by use of a plasma CVD device. The passivation layer 22 may have a stack structure of $SiO_2$ and $SiN_x$. In the case where the $SiO_2$ film is located as a lower layer of the stack structure that is to be in contact with the oxide semiconductor layer 18, the oxide semiconductor layer 18 is prevented from being depleted of oxygen.

Then, the oxide semiconductor TFT 5 may be thermally treated at a temperature of, for example, 200° C. to 400° C. for 1 to 2 hours in dry air or the atmosphere in order to be stabilized in the characteristics (threshold voltage Vth, etc.).

An example of method for producing the TFT substrate 100 is described above. The TFT substrate 100 may be produced in any other appropriate method. For example, with the above-described method, the source and drain layer is formed and then the oxide semiconductor layer 18 is subjected to the plasma processing. Alternatively, after the oxide semiconductor layer 18 is formed but before the source and drain layer is formed, the plasma processing may be performed to control the carrier concentration. In this case, the carrier concentration of the source connecting region 18*s* and the drain connecting region 18*d* shown in FIG. 3(*c*) are also controlled in substantially the same manner as the carrier concentration of the other regions.

Now, with reference to FIG. 4(*a*), a liquid crystal display device including a TFT substrate 110 in another form of embodiment 1 will be described. FIG. 4(*a*) shows, in enlargement, an area where the TFT 5 is formed and the vicinity thereof in one pixel in the TFT substrate 110 usable in a liquid crystal display device.

The liquid crystal display device includes a plurality of pixels arrayed in a matrix having a row direction and a column direction. The TFT substrate 110 includes a plurality of regions corresponding to the plurality of pixels of the display device (hereinafter, such regions will be referred to as "pixel regions"). The TFT substrate 110 includes a plurality of source bus lines 4 extending generally parallel to the column direction and a plurality of gate bus lines 2 extending generally parallel to the row direction. The row direction and the column direction may be perpendicular to each other. The row direction and the column direction may be respectively a horizontal direction and a vertical direction on a display screen of the liquid crystal display device.

As shown in FIG. 4(a), the pixel regions in the TFT substrate 110 each include the TFT 5 connected with the gate bus line 2 and the source bus line 4 and a pixel electrode 19. The pixel electrode 19 is formed of a transparent conductive material, for example, ITO (indium tin oxide). The pixel electrode 19 is connected with the drain electrode 16 of the TFT 5 in a pixel contact hole CH formed in an insulating layer covering the TFT 5 (the insulating layer is, for example, the above-described passivation layer or an organic interlayer insulating layer). FIG. 4(a) shows the pixel electrodes 19 of two pixels adjacent to each other while having the gate bus line 2 therebetween. With the structure shown in FIG. 4(a), the pixel electrode 19 of the pixel below the gate bus line 2 is located so as to overlap the source-side offset region 18os of the oxide semiconductor layer 18 included in the TFT 5 in the pixel above the gate bus line 2.

The liquid crystal display device in this embodiment may include a storage capacitor electrically connected parallel with a liquid crystal capacitor via an interlayer insulating layer. The pixel structure in this embodiment may be substantially the same as that of the pixel structure of a known liquid crystal display device.

The gate electrode 12 may be formed by patterning a conductive film from which the gate bus lines 2 is also formed by patterning. It is sufficient that the gate electrode 12 is electrically connected with the gate bus line 2. As shown in FIG. 4(a), the gate electrode 12 may be a part of the gate bus line 2. With this structure, a part of the gate bus line 2 that overlaps the oxide semiconductor layer 18 of the TFT 5 acts as the gate electrode 12.

The source electrode 14 and the gate electrode 16 may be formed by patterning a conductive film from which the source bus lines 4 is also formed by patterning. It is sufficient that the source electrode 14 is electrically connected with the source bus line 4. As shown in, for example, FIG. 4(a), the source electrode 14 may be a part of the source bus line 4. With this structure, a part of the source bus line 4 that contacts the oxide semiconductor layer 18 of the TFT 5 acts as the source electrode 14. The drain electrode 16 is formed so as to contact the oxide semiconductor layer 18 and also so as to at least partially overlap a region inner to the contact hole CH.

With this structure, the channel region and the source/drain connecting regions of the TFT 5 are allowed to be located to be away from each other, and thus the level of the parasitic capacitances of the TFT 5 is made low. Since the oxide semiconductor layer 18 is light-transmissive, the offset regions 18os and 18od are usable for the display region (for example, the area where the pixel electrode 19 and the offset region 18os overlap each other is also usable for the display region). Therefore, the light blocking region is made relatively small with respect to the area of the TFT 5, which further increases the aperture ratio.

FIG. 4(b) shows a TFT 5B in a reference example. The TFT 5B is provided at an intersection of a gate bus line 2B and a source bus line 4B. An oxide semiconductor layer 18B of the TFT 5B has a high resistance, and thus the entirety of the channel region held between a source electrode 14B and a drain electrode 16B needs to be activated. For this purpose, a gate electrode 12B connected with the gate bus lines 2B is formed to overlap the entirety of the oxide semiconductor layer 18B. Such a structure increases the size of the area blocked against light by the gate electrode 12B, which decreases the aperture ratio. In addition, the area where the oxide semiconductor layer 18B and the drain electrode 16B overlap each other needs to have a relatively large area size, and also the drain electrode 16B and a pixel electrode 19B contact each other at a position away from the channel. As a result, the light blocking region has a large area size with respect to the pixel region. This makes it difficult to increase the aperture ratio.

With the structure shown in FIG. 4(b), the area where the gate electrode 12B and the source bus lines 4B overlap each other, and the area where the gate electrode 12B and the drain electrode 16B overlap each other, have a large area size. This causes a problem that the parasitic capacitances Cgs and Cgd have a high level. By contrast, the structure of this embodiment shown in FIG. 4(a) enlarges the display region while decreasing the level of the parasitic capacitances Cgs and Cgd.

The TFT substrates 100 and 110 in this embodiment according to the present invention are described above. Since the gate electrode 12 and the source/drain electrodes 14 and 16 are away from each other while the offset regions 18os and 18od of the oxide semiconductor layer 18 having a sufficiently low resistance is held between the gate electrode 12 and the source/drain electrodes 14 and 16. Therefore, the level of the parasitic capacitances is decreased while the on/off ratio is increased. When the TFT substrate 100 or 110 is used for a liquid crystal display device, the aperture ratio is increased and the pixel voltage is suppressed from being decreased by the field through voltage.

Embodiment 2

Figure 5:
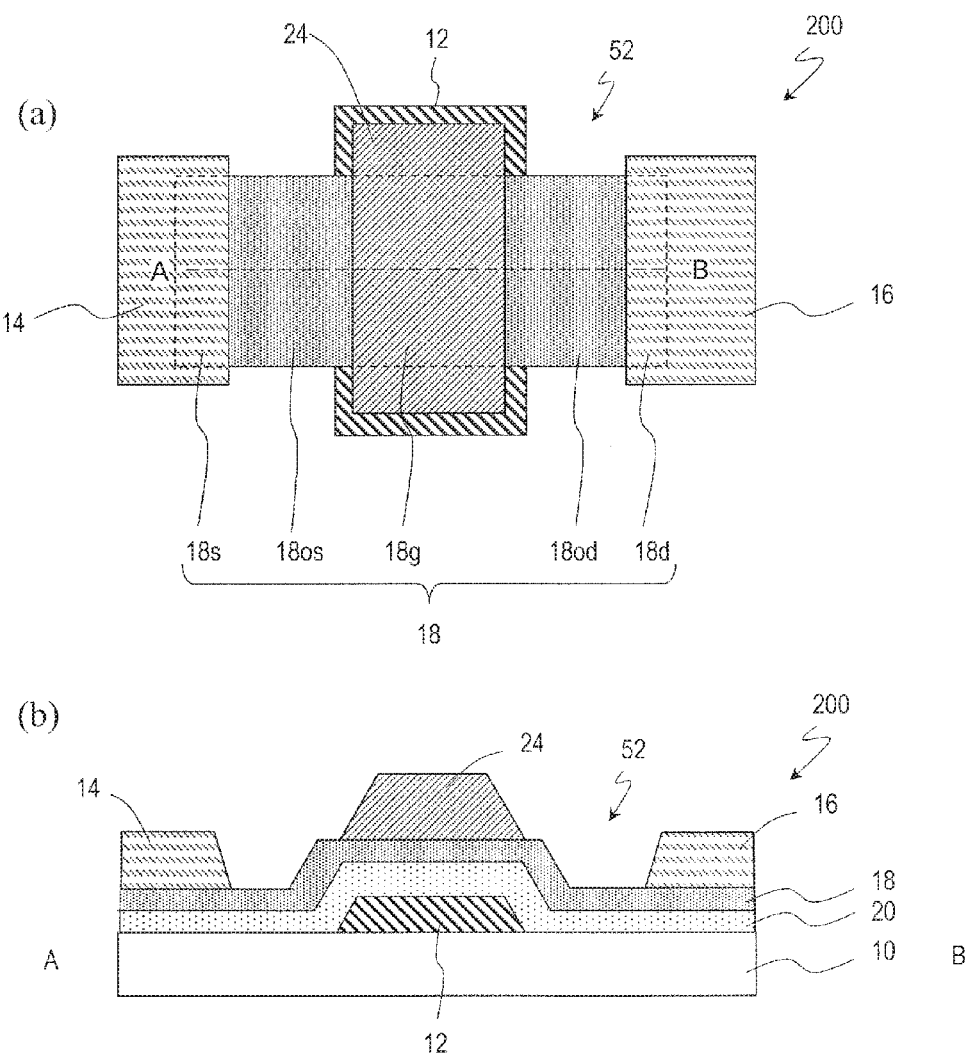
FIG. 5 shows a TFT substrate in embodiment 2 according to the present invention.

FIG. 5(a) is a plan view showing a TFT substrate 200 in embodiment 2, and FIG. 5(b) is a cross-sectional view of the TFT substrate 200 taken along line A-B of FIG. 5(a).

As shown in FIG. 5(a) and FIG. 5(b), the TFT substrate 200 in embodiment 2 includes a TFT 52 provided on a substrate 10. FIG. 5(a) and FIG. 5(b) each show one TFT 52. Alternatively, the TFT substrate 200 may include a plurality of TFTs 52, needless to say.

The TFT substrate 200 in this embodiment is mainly different from the TFT substrate 100 in embodiment 1 in that the TFT substrate 200 includes an etch stop layer 24 provided so as to cover a gate facing region 18g of an oxide semiconductor layer 18. The etch stop layer 24 is provided to order to protect the gate facing region 18g in a step of etching a source and drain layer. The TFT substrate 200 is substantially the same as the TFT substrate 100 in embodiment 1 except for this point. Components substantially the same as those of the TFT substrate 100 will bear the same reference signs and detailed descriptions thereof may be omitted.

In this embodiment also, the TFT 52 has a bottom gate-type structure, and includes a gate electrode 12 provided on the substrate 10, which is insulating, a gate insulating layer 20 covering the gate electrode 12, and the oxide semiconductor layer 18, which typically has an island-shape, provided on the gate insulating layer 20. A source electrode 14 and a drain electrode 16 of the TFT 52 are located to be away from the gate electrode 12 as seen in the direction of normal to the substrate.

Like in embodiment 1, the oxide semiconductor layer 18 may contain, for example, an In—Ga—Zn—O-based oxide, or may contain any of various other oxide semiconductors described above.

Like in the TFT 5 in embodiment 1, in the TFT 52, the oxide semiconductor layer 18 includes the gate facing region 18g overlapping the gate electrode 12, a source connecting region 18s overlapping the source electrode 14, and a drain connecting region 18d overlapping the drain electrode 16, as seen in the direction of normal to the substrate. The oxide semiconductor layer 18 includes a source-side offset region 18os located between the source connecting region 18s and the gate facing region 18g, and a drain-side offset region 18od located between the drain connecting region 18d and the gate facing region 18g. The offset regions 18os and 18od do not overlap the gate electrode 12, the source electrode 14 or the drain electrode 16.

The carrier concentration may be substantially the same in the entirety of the oxide semiconductor layer 18 of the TFT 52. As described below regarding a production method, the entirety of the oxide semiconductor layer 18 is formed of the same oxide semiconductor film and is subjected to the same carrier concentration control process (e.g., plasma processing). It should be noted that the source connecting region 18s and the drain connecting region 18d may have a lower resistance by the influence of the source electrode 14 and the drain electrode 16 in contact therewith. As described below, a resistance decreasing process may be performed on the regions of the oxide semiconductor layer 18 other than the gate facing region 18g, so that the gate facing region 18g has a different carrier concentration from that of the other regions of the oxide semiconductor layer 18.

Like in embodiment 1, the carrier concentration of the gate facing region 18g and the offset regions 18os and 18od is controlled to be in the range of $1 \times 10^{17}/cm^3$ or greater and $1 \times 10^{19}/cm^3$ or less in order to provide a sufficiently high ON current. In this embodiment, it is sufficient that the carrier concentration of at least the gate facing region 18g is set to be in the above-described range, and the carrier concentration of the offset regions 18os and 18od may exceed $1 \times 10^{19}/cm^3$. Namely, the carrier concentration of the offset regions 18os and 18od merely needs to be $1 \times 10^{17}/cm^3$ or greater.

The carrier concentration of the source connecting region 18s and the drain connecting region 18d may be $1 \times 10^{17}/cm^3$ or greater.

As described above, the offset regions 18os and 18od, the source connecting region 18s and the drain connecting region 18d may have a carrier concentration exceeding $1 \times 10^{19}/cm^3$. Alternatively, in the case where a common resistance decreasing process is used, the offset regions 18os and 18od, the source connecting region 18s and the drain connecting region 18d may be set to have a carrier concentration of, for example, $1 \times 10^{21}/cm^3$ or less.

In the case where additional plasma processing is performed on the offset regions 18os and 18od, the source connecting region 18s and the drain connecting region 18d, the electrical resistance of these regions may occasionally be significantly low. In this specification, such a region having a low resistance may also be expressed as being a part of the "oxide semiconductor layer".

Setting the carrier concentration of the oxide semiconductor layer 18 to be in such an appropriate range in this manner suppresses the off-leak current while providing a sufficiently high ON current. This provides a good on/off ratio.

The TFT 52 in this embodiment includes the etch stop layer 24 provided in an island shape so as to selectively cover the gate facing region 18g of the oxide semiconductor layer 18. The etch stop layer 24 is formed of an insulating material such as $SiO_2$, $SiN_x$ or the like. The etch stop layer 24 acts to prevent the gate facing region 18g, which is a channel region of the oxide semiconductor layer 18, from being damaged by etching during the step of forming the source electrode 14 and the drain electrode 16.

In the embodiment shown in the figures, the etch stop layer 24 is provided so as not to cover the offset region 18os or 18od. The etch stop layer 24 is not limited to being provided in this manner. The etch stop layer 24 may be provided so as to cover the offset regions 18os and 18od. In the case where the etch stop layer 24 does not cover the offset region 18os or 18od as shown in the figures, it is relatively easy to make the carrier concentration of the gate facing region 18g of the oxide semiconductor layer 18 different from that of the offset regions 18os and 18od, and thus to further increase the conductivity of the offset regions 18os and 18od.

The etch stop layer 24 is described above as being provided in the island shape at a position corresponding to the gate facing region 18g (or the gate electrode 12). The etch stop layer 24 is not limited to being provided in such a manner. The etch stop layer 24 may be provided so as to cover the entirety of the TFT 52. In this case, contact holes are formed in the etch stop layer 24 in positional correspondence with the source connecting region 18s and the drain connecting region 18d of the oxide semiconductor layer 18, and the source electrode 14 and the drain electrode 16 are respectively connected with the source connecting region 18s and the drain connecting region 18d via the contact holes.

The TFT 52 is also typically of a depression type, in which the drain current Id has a substantive level when the gate-source voltage Vgs is 0 V. The TFT 52 may also be controlled such that the OFF voltage Vgl applied to the gate electrode 12 in an OFF period of the TFT is a negative voltage.

Figure 6:
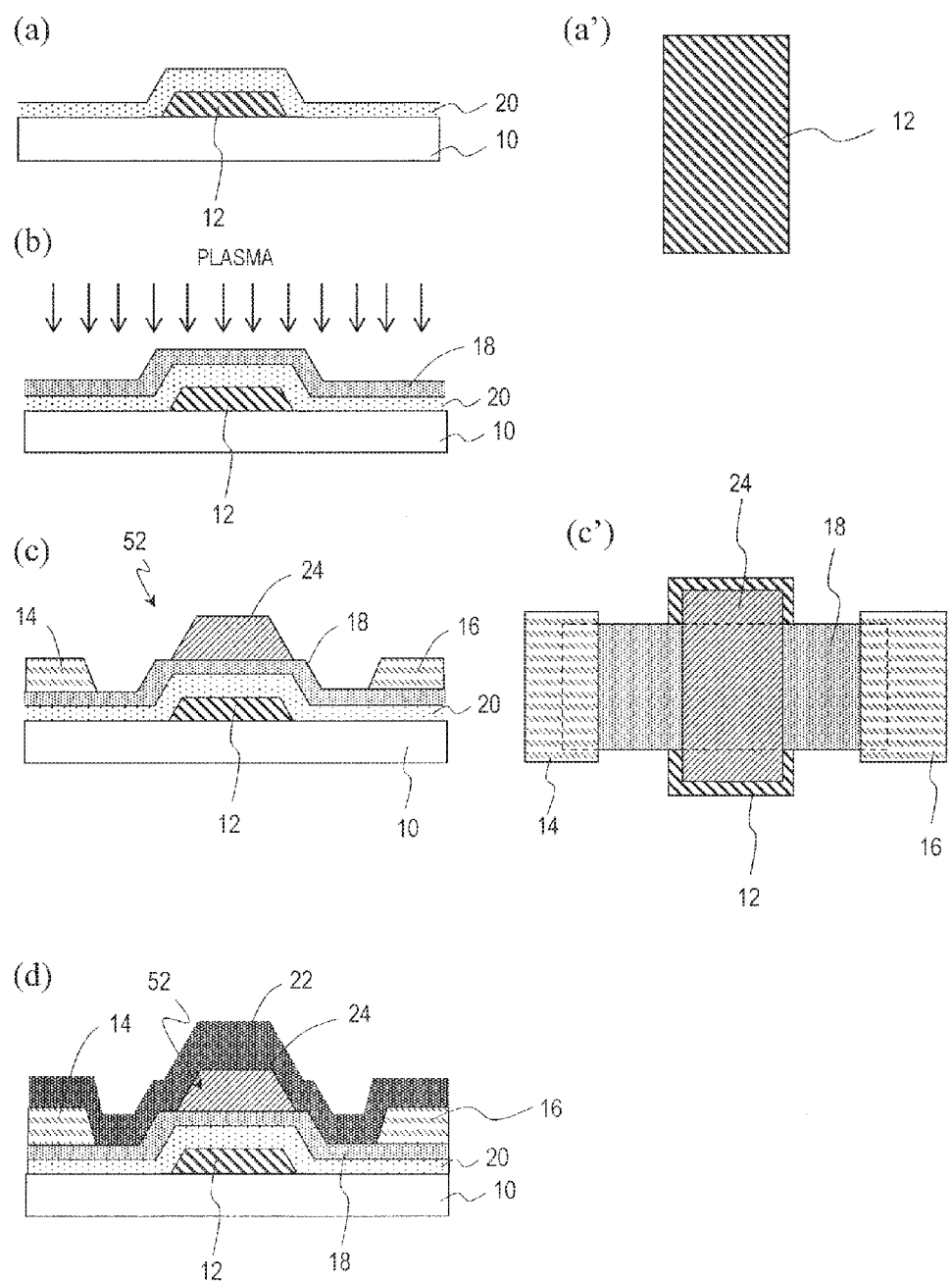
FIG. 6(*a*) through FIG. 6(*d*) are cross-sectional views showing a method for producing the TFT substrate in embodiment 2 according to the present invention.

Hereinafter, with reference to FIG. 6(a) through FIG. 6(d), FIG. 6(a') and FIG. 6(c'), an example of method for producing the TFT substrate 200 in this embodiment will be described. FIG. 6(a') and FIG. 6(c') are plan views corresponding to FIG. 6(a) and FIG. 6(c).

First, a metal film for the gate electrode is formed on the substrate 10 shown in FIG. 6(a), which is transparent and insulating and is formed of glass or a plastic material. The metal film is patterned by a known photolithography method to form a gate line layer including the gate electrode 12 (FIG. 6(a) and FIG. 6(a')). Then, as shown in FIG. 6(a), the gate insulating layer 20 is formed so as to cover the gate line layer. These steps may be substantially the same as those of the method for producing the TFT substrate 100 in embodiment 1 described above with reference to FIG. 3(a).

Next, as shown in FIG. 6(b), an oxide semiconductor film is formed on the gate insulating layer 20 to have a thickness of, for example, 20 nm to 100 nm by use of a sputtering device of the like, and the oxide semiconductor film is patterned by photolithography to form the oxide semiconductor layer 18, which is typically island-shaped. Then, plasma processing is performed in order to control the carrier concentration of the oxide semiconductor layer 18. The plasma processing may be realized by, for example, plasma irradiation performed in a plasma CVD device by use of reducing gas such as hydrogen gas or the like, or by use of argon gas or the like. As a result of the plasma processing, the carrier concentration of the entirety of the oxide semiconductor layer 18 is controlled to be in the range of $1\times10^{17}$/cm³ or greater and $1\times10^{19}$/cm³ or less. The above-described oxide semiconductor layer formation process and the carrier concentration control process may also be substantially the same as those of the method for producing the TFT substrate 100 in embodiment 1 described above with reference to FIG. 3(c).

Then, as shown in FIG. 6(c) and FIG. 6(c'), a silicon oxide (SiO₂) film as an etch stop film is formed at a temperature of 300° C. to 400° C. by use of, for example, a plasma CVD device, and is patterned by photolithography to form the island-shaped etch stop layer 24. It is preferable that the etch stop layer 24 is provided so as to cover most of at least the gate facing region 18g (channel region) of the etch stop layer 24.

Then, a metal film for forming a source and drain layer including the source electrode and the drain electrode is formed by a use of, for example, a sputtering device, and is patterned by photolithography to form the source and drain layer including the source electrode 14 and the drain electrode 16. This step may also be substantially the same as that of the method for producing the TFT substrate 100 in embodiment 1 described above with reference to FIG. 3(b).

In the above-described step, etching is performed on the metal film in the state where portions thereof which are to be the source electrode 14 and the drain electrode 16 (i.e., portions overlapping the source connecting region 18s and the drain connecting region 18d of the oxide semiconductor layer 18) are covered with a photoresist. A portion of the metal film that is removed by the etching includes a portion overlapping the gate facing region 18g of the oxide semiconductor layer 18 and portions overlapping the offset regions 18os and 18od of the oxide semiconductor layer 18.

The etch stop layer 24 covers the gate facing region 18g of the oxide semiconductor layer 18. Therefore, the gate facing region 18g is prevented from being damaged by the etching process. Therefore, the carrier concentration of the gate facing region 18g is generally kept at the level obtained by the control by the plasma processing performed previously.

By contrast, the offset regions 18os and 18od, which are not covered with the etch stop layer 24, may have the carrier concentration thereof changed by the etching. In general, when being subjected to a dry etching process, the offset regions 18os and 18od have the carrier concentration thereof increased by plasma damage given to the oxide semiconductor layer. This is considered to occur because the plasma damage increases oxygen vacancies in the offset regions 18os and 18od. As can be seen, the carrier concentration of the offset regions 18os and 18od is changed to be higher than that of the gate facing region 18g.

Then, as shown in FIG. 6(d), a passivation layer 22 as a protective layer is formed so as to cover the oxide semiconductor TFT 52. This step may also be substantially the same as that of the method for producing the TFT substrate 100 in embodiment 1 described above with reference to FIG. 3(d).

Then, the oxide semiconductor TFT 52 may be thermally treated at a temperature of, for example, about 200° C. to 400° C. for about 1 to 2 hours in dry air or the atmosphere in order to be stabilized in the characteristics (threshold voltage Vth, etc.).

An example of method for producing the TFT substrate 200 in embodiment 2 is described above. The TFT substrate 200 may be produced in any other appropriate method. For example, in addition to the plasma processing performed on the entirety of the oxide semiconductor layer 18 as shown in FIG. 6(b), additional plasma processing (resistance decreasing process) may be performed after the etch stop layer 24 is formed but before the source and drain layer is formed. In this case, the offset regions 18os and 18od, the source connecting region 18s and the drain connecting region 18d may have the carrier concentration thereof increased to be higher than the carrier concentration of the gate facing region 18g covered with the etch stop layer 24, and thus may have a lower resistance. Alternatively, after the source electrode 14 and the drain electrode 16 are formed, the additional plasma processing (resistance decreasing process) may be performed.

Figure 7:
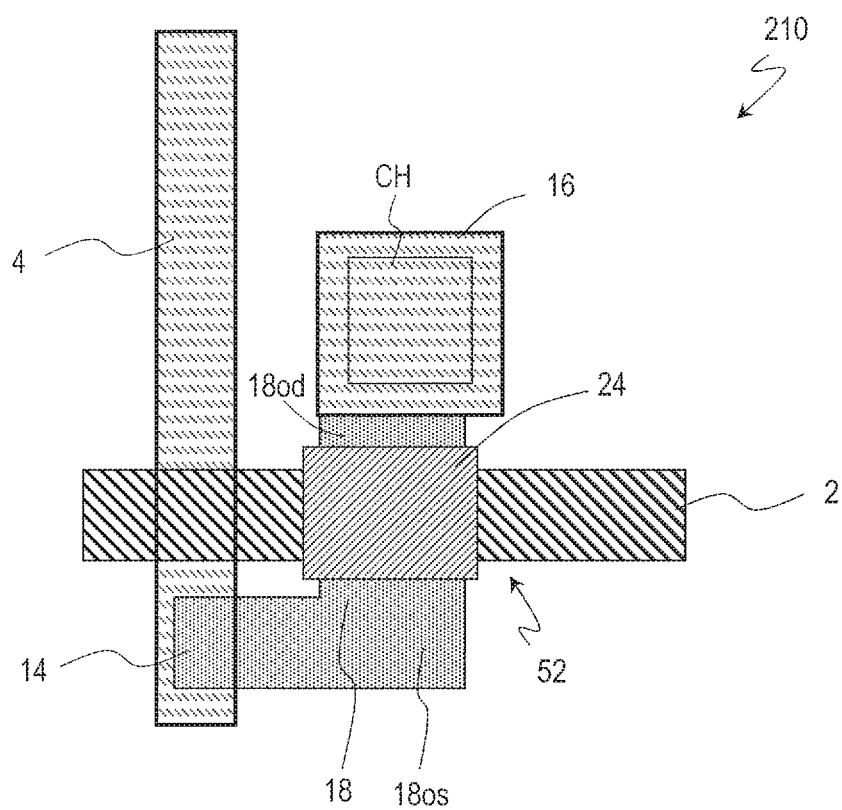
FIG. 7 is a plan view showing an example of structure in the case where the TFT substrate in embodiment 2 is used for a liquid crystal display device.

Now, with reference to FIG. 7, an example of liquid crystal display device including a TFT substrate 210 in another form of embodiment 2 will be described. FIG. 7 shows an area generally corresponding to one pixel in the TFT substrate 210 usable in a liquid crystal display device.

Like in embodiment 1, the liquid crystal display device includes a plurality of pixels arrayed in a matrix having a row direction and a column direction. The TFT substrate 210 includes a plurality of pixel regions corresponding to the plurality of pixels of the display device. The TFT substrate 210 includes a plurality of source bus lines 4 extending generally parallel to the column direction and a plurality of gate bus lines 2 extending generally parallel to the row direction.

As shown in FIG. 7, the pixel regions in the TFT substrate 210 each include the TFT 52 connected with the gate bus line 2 and the source bus line 4 and a pixel electrode (not shown). The pixel electrode is electrically connected with the drain electrode 16 of the TFT 52 in a pixel contact hole CH formed in an insulating layer covering the TFT 52 (the insulating layer is, for example, the above-described passivation layer or an organic interlayer insulating layer).

The gate electrode 12 of the TFT 52 may be a part of the gate bus line 2. With this structure, a part of the gate bus line 2 that overlaps the oxide semiconductor layer 18 of the TFT 52 acts as the gate electrode.

The source electrode 14 of the TFT 52 may be a part of the source bus line 4. With this structure, apart of the source bus line 4 that contacts the oxide semiconductor layer 18 of the TFT 52 acts as the source electrode 14. The drain electrode 16 is located so as to contact the oxide semiconductor layer 18 and also so as to at least partially overlap a region inner to the contact hole CH.

With this structure, the channel region and the source/drain connecting regions of the TFT 52 are allowed to be located to be away from each other, and thus the level of the parasitic capacitances of the TFT 52 is made low. Since the oxide semiconductor layer 18 is typically transparent, the offset regions 18os and 18od are usable for display. Therefore, the light blocking region is made relatively small with respect to the area of the TFT 52, which further increases the aperture ratio.

The TFT substrates 200 and 210 in embodiment 2 according to the present invention are described above. Since the gate electrode 12 and the source/drain electrodes 14 and 16 are away from each other while the offset regions 18os and 18od of the oxide semiconductor layer 18 having a sufficiently low resistance is held between the gate electrode 12 and the source/drain electrodes 14 and 16. Therefore, the level of the parasitic capacitances is decreased while the on/off ratio is increased. When the TFT substrate 200 or 210 is used for a liquid crystal display device, the aperture ratio is increased and the pixel voltage is suppressed from being decreased by the field through voltage.

In this embodiment, the etch stop layer 24 is provided, and thus the influence of the etching process on the gate facing region 18g is decreased. Therefore, the carrier concentration of the gate facing region 18g is easily controlled appropriately. Also in this embodiment, it is relatively easy to make the carrier concentration of the offset regions 18os an 18od higher than the carrier concentration of the gate facing region 18g and thus to further decrease the resistance of the offset regions 18os an 18od. Therefore, the ON current is easily made high and the on/off ratio is increased.

Embodiment 3

Figure 8:
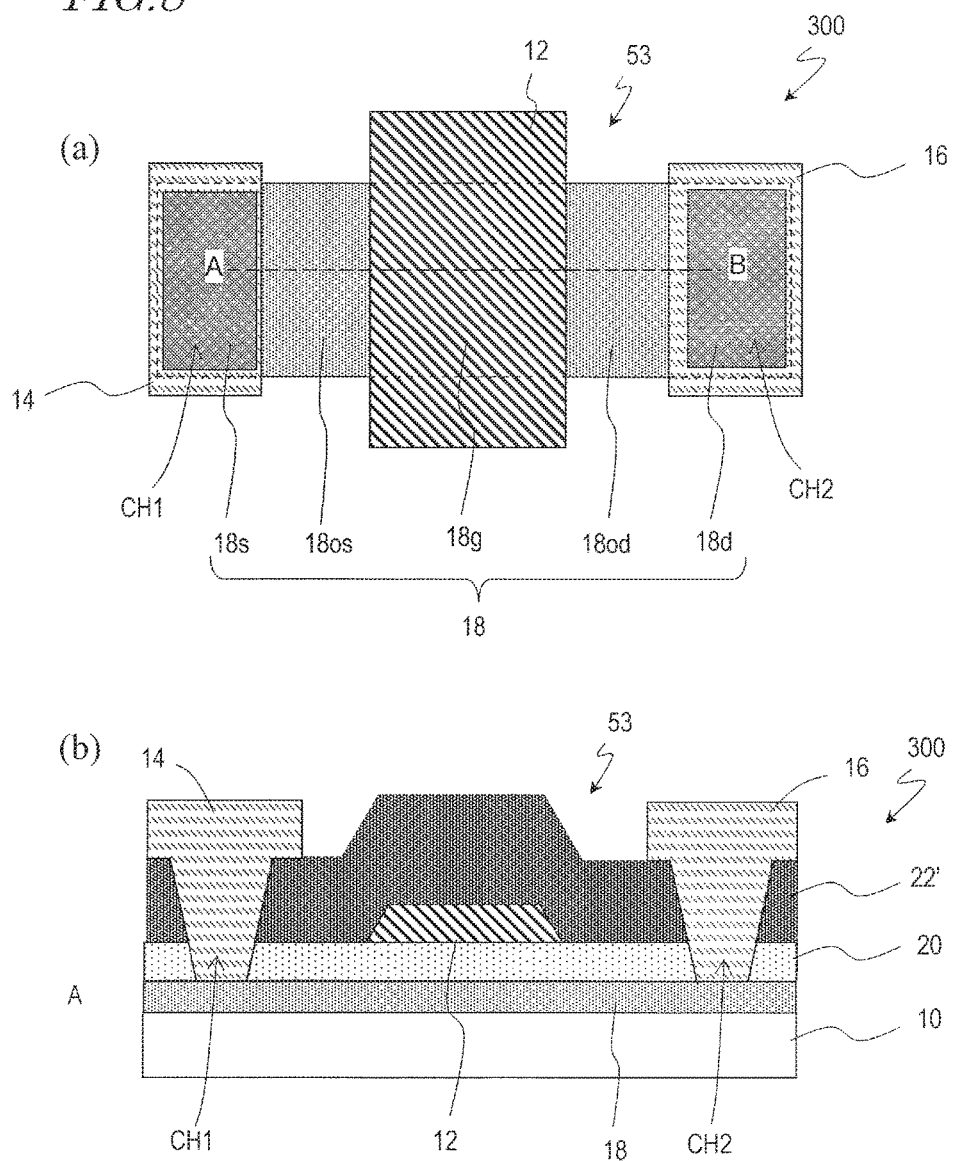
FIG. 8 shows a TFT substrate in embodiment 3 according to the present invention.

FIG. 8(a) is a plan view showing a TFT substrate 300 in embodiment 3, and FIG. 8(b) is a cross-sectional view of the TFT substrate 300 taken along line A-B of FIG. 8(a).

As shown in FIG. 8(a) and FIG. 8(b), the TFT substrate 300 in embodiment 3 includes a TFT 53 provided on a substrate 10. FIG. 8(a) and FIG. 8(b) each show one TFT 53. Alternatively, the TFT substrate 300 may include a plurality of TFTs 53, needless to say.

The TFT substrate 300 in this embodiment is mainly different from the TFT substrate 100 in embodiment 1 in that the TFT 53 has a top gate-type structure. In the TFT 53, a gate electrode 12 is an upper layer with respect to the oxide semiconductor layer 18.

In this embodiment, the top gate-type TFT 53 included in the TFT substrate 300 includes an oxide semiconductor layer 18 provided on the substrate 10, which is insulating, a gate insulating layer 20 covering the oxide semiconductor layer 18, and the gate electrode 12 provided on the gate insulating layer 20 so as to overlap at least a part of the oxide semiconductor layer 18.

Like in embodiment 1, the oxide semiconductor layer 18 may contain, for example, an In—Ga—Zn—O-based oxide, or may contain any of various other oxide semiconductors described above.

An interlayer insulating layer 22' is provided on the gate electrode 12. A source electrode 14 and a drain electrode 16 are provided on the interlayer insulating layer 22'. The source electrode 14 and the drain electrode 16 are respectively connected with a source connecting region 18s and a drain connecting region 18d of the oxide semiconductor layer 18 via contact holes CH1 and CH2 formed so as to run through the interlayer insulating layer 22' and the gate insulating layer 20. The source electrode 14 and the drain electrode 16 are located to be away from the gate electrode 12 as seen in the direction of normal to the substrate.

In the TFT 53 in this embodiment also, like in the TFT 5 in embodiment 1, the oxide semiconductor layer 18 includes agate facing region 18g overlapping the gate electrode 12, the source connecting region 18s overlapping the source electrode 14, and the drain connecting region 18d overlapping the drain electrode 16, as seen in the direction of normal to the substrate. The oxide semiconductor layer 18 includes a source-side offset region 18os located between the source connecting region 18s and the gate facing region 18g, and a drain-side offset region 18od located between the drain connecting region 18d and the gate facing region 18g. The offset regions 18os and 18od do not overlap the gate electrode 12, the source electrode 14 or the drain electrode 16.

The carrier concentration may be substantially the same in the entirety of the oxide semiconductor layer 18 of the TFT 53. As described below regarding a production method, the entirety of the oxide semiconductor layer 18 is formed of the same oxide semiconductor film and is subjected to the same carrier concentration control process (e.g., plasma processing). It should be noted that the source connecting region 18s and the drain connecting region 18d may have a lower resistance by the influence of the source electrode 14 and the drain electrode 16 in contact therewith. As described below, a resistance decreasing process may be performed on the regions of the oxide semiconductor layer 18 other than the gate facing region 18g, so that the gate facing region 18g has a different carrier concentration from that of the other regions.

In this embodiment also, the carrier concentration of the gate facing region 18g and the offset regions 18os and 18od is controlled to be in the range of $1 \times 10^{17}/cm^3$ or greater and $1 \times 10^{19}/cm^3$ or less in order to provide a sufficiently high ON current. In this embodiment, it is sufficient that the carrier concentration of at least the gate facing region 18g is set to be in the above-described range, and the carrier concentration of the offset regions 18os and 18od may exceed $1 \times 10^{19}/cm^3$. Namely, the carrier concentration of the offset regions 18os and 18od merely needs to be $1 \times 10^{17}/cm^3$ or greater.

Setting the carrier concentration of the oxide semiconductor layer 18 to be in such an appropriate range in this manner suppresses the off-leak current while providing a sufficiently high ON current. This provides a good on/off ratio.

The TFT 53 is also typically of a depression type, in which the drain current Id has a substantive level when the gate-source voltage Vgs is 0 V. The TFT 53 may also be controlled such that the OFF voltage Vgl applied to the gate electrode 12 in an OFF period of the TFT is a negative voltage.

Figure 9:
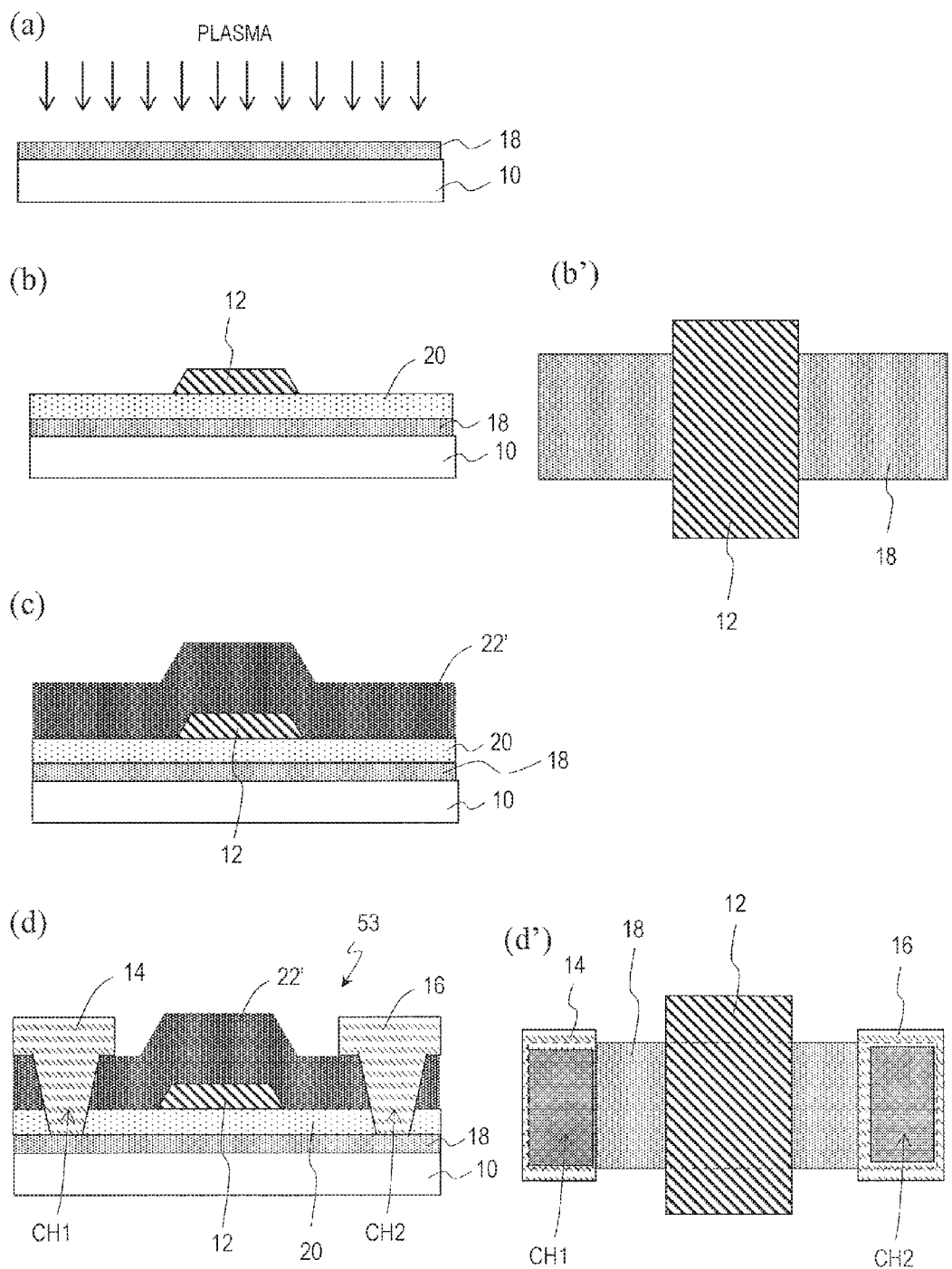
FIG. 9(*a*) through FIG. 9(*d*) are cross-sectional views showing a method for producing the TFT substrate in embodiment 3 according to the present invention.

Hereinafter, with reference to FIG. 9(a) through FIG. 9(d), FIG. 9(b') and FIG. 9(d'), an example of method for producing the TFT substrate 300 in this embodiment will be described. FIG. 9(b') and FIG. 9(d') are plan views corresponding to FIG. 9(b) and FIG. 9(d).

First, as shown in FIG. 9(a), an oxide semiconductor film is formed on the substrate 10, which is transparent and insulating and is formed of glass or a plastic material. The oxide semiconductor film is patterned by photolithography to form the oxide semiconductor layer 18, which is typically island-shaped. In order to prevent diffusion of impurities to the oxide semiconductor layer 18 from the insulating substrate 10, a base coat layer (not shown) of $SiN_x$ or the like may be formed on the insulating substrate 10 before the oxide semiconductor film is formed.

Then, plasma processing is performed in order to control the carrier concentration of the oxide semiconductor layer 18. The plasma processing may be realized by, for example, plasma irradiation performed in a plasma CVD device by use of reducing gas such as hydrogen gas or the like, or by use of argon gas or the like. As a result of the plasma processing, the carrier concentration of the entirety of the oxide semiconductor layer 18 is controlled to be in the range of $1 \times 10^{17}/cm^3$ or greater and $1 \times 10^{19}/cm^3$ or less. The above-described oxide semiconductor layer formation process and the carrier concentration control process may be substantially the same as those of the method for producing the TFT substrate 100 in embodiment 1 described above with reference to FIG. 3(c).

In the above example, the island-shaped oxide semiconductor layer 18 is formed and then the plasma processing is performed. The production method is not limited to this. After the oxide semiconductor film is formed but before patterning is performed, plasma processing may be performed to control the carrier concentration and then the oxide semiconductor layer 18 may be formed.

Next, as shown in FIG. 9(b) and FIG. 9(b'), the gate insulating layer 20 is formed so as to cover the oxide semiconductor layer 18. A metal film for the gate electrode is formed on the gate insulating layer 20, and is patterned by a known photolithography method to form a gate line layer including the gate electrode 12. The step of forming the gate insulating layer 20 and the step of forming the gate line layer may be substantially the same as those of the method for producing the TFT 100 in embodiment 1 described above with reference to FIG. 3(a).

The metal film for the gate electrode is patterned such that the gate electrode 12 overlaps only a part of the oxide semiconductor layer 18. The gate electrode 12 is typically formed so as to cross a central part of the oxide semiconductor layer 18, and regions of the oxide semiconductor layer 18 that are not covered with the gate electrode 12 are formed to the sides of the gate electrode 12.

Then, as shown in FIG. 9(c), the interlayer insulating layer 22' is formed so as to cover the gate line layer including the gate electrode 12. In order to form interlayer insulating layer 22', for example, a silicon oxide ($SiO_2$) film or a silicon nitride ($SiN_x$) film is formed to have a thickness of 200 nm to 500 nm at a temperature of 300° C. to 400° C. by use of a plasma CVD device. The interlayer insulating layer 22' may have a stack structure including the $SiO_2$ film and the $SiN_x$ film.

Next, as shown in FIG. 9(d), the contact hole CH1, which is on the source side, and the contact hole CH2, which is on the drain side, both running through the interlayer insulating layer 22' and the gate insulating layer 20 and reaching the oxide semiconductor layer 18 are formed to the sides of the gate electrode 12 so as to have the gate electrode 12 therebetween. The contact holes CH1 and CH2 may be formed by photolithography. In this step, the contact holes CH1 and CH2 are each formed at a position away from the gate electrode 12 by a predetermined distance so as to overlap a part of the oxide semiconductor layer 18.

Then, a metal film for forming a source and drain layer is formed by a use of, for example, a sputtering device, and is patterned by photolithography to form the source and drain layer including the source electrode 14 and the drain electrode 16. This step may also be substantially the same as that of the method for producing the TFT substrate 100 in embodiment 1 described above with reference to FIG. 3(b).

The source electrode 14 and the drain electrode 16 are respectively connected with the oxide semiconductor layer 18 via the source-side contact hole CH1 and the drain-side contact hole CH2. Thus, the top gate-type oxide semiconductor TFT 53 is produced.

Then, although not shown, a passivation layer as a protective layer is formed so as to cover the oxide semiconductor TFT 53. This step may also be substantially the same as that of the method for producing the TFT substrate 100 in embodiment 1 described above with reference to FIG. 3(d).

Then, the oxide semiconductor TFT 53 may be thermally treated at a temperature of, for example, 200° C. to 400° C. for 1 to 2 hours in dry air or the atmosphere in order to be stabilized in the characteristics (threshold voltage Vth, etc.).

Figure 10:
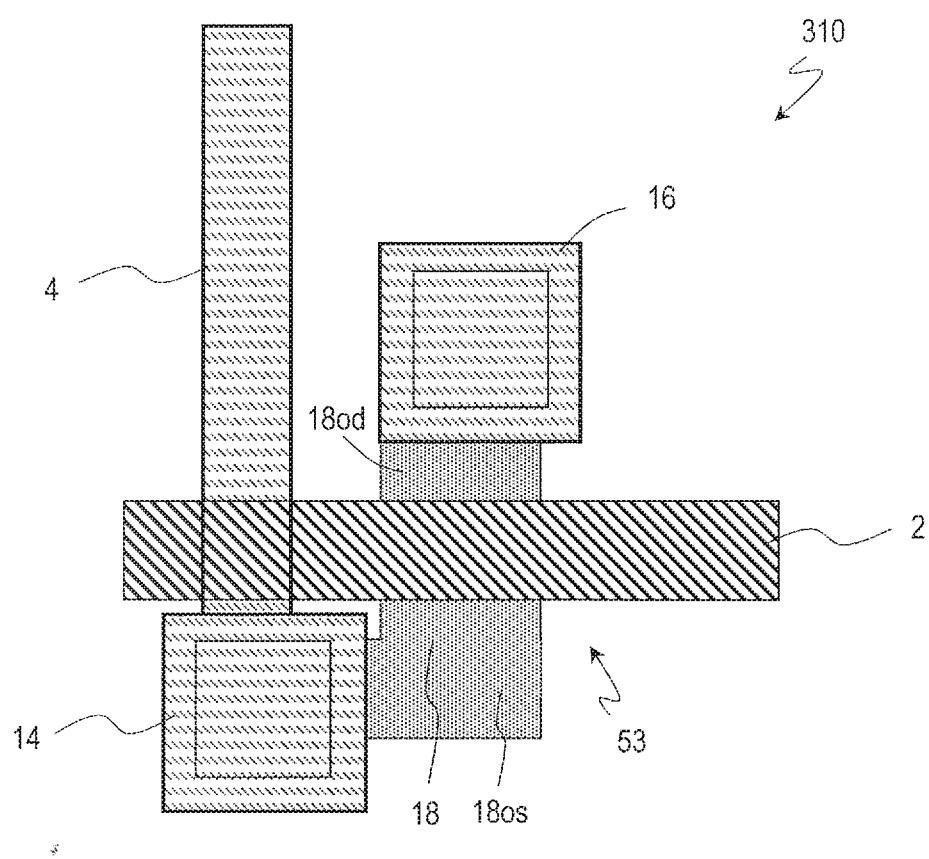
FIG. 10 is a plan view showing an example of structure in the case where the TFT substrate in embodiment 3 is used for a liquid crystal display device.
Figure 11:
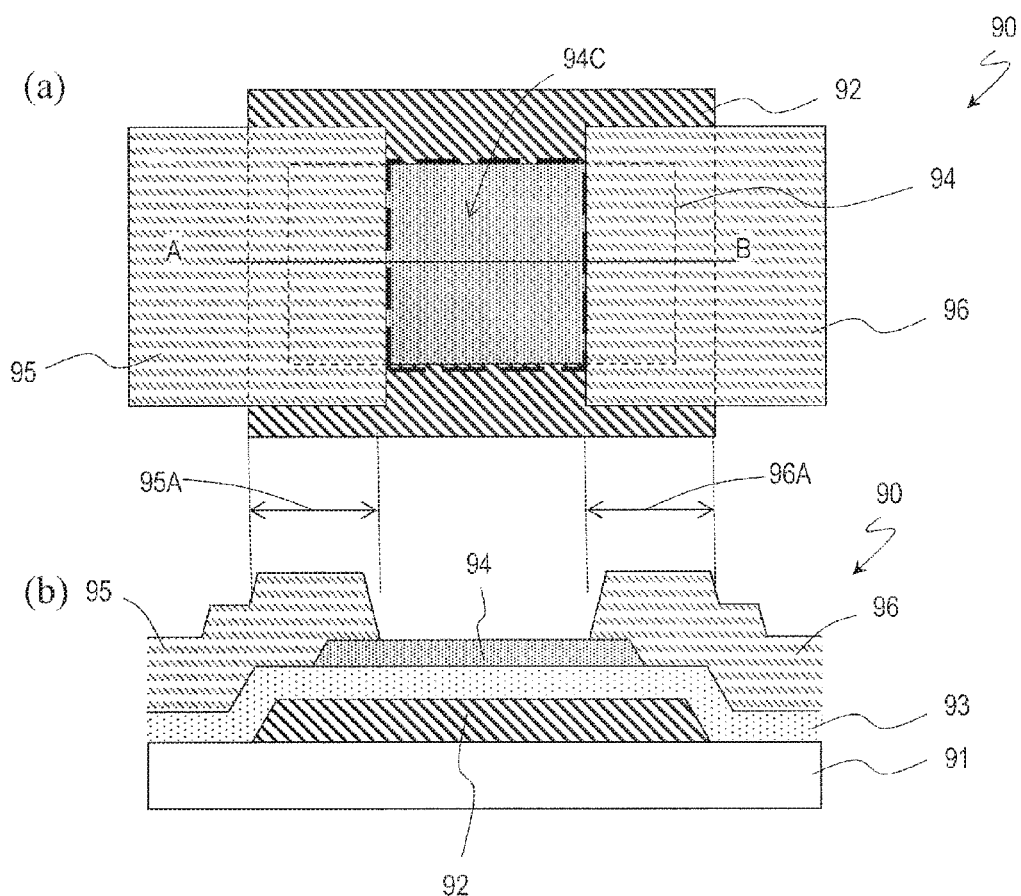
FIG. 11 shows a conventional TFT substrate.

Now, with reference to FIG. 10, an example of liquid crystal display device including a TFT substrate 310 in another form of embodiment 3 will be described. FIG. 10 shows an area generally corresponding to one pixel in the TFT substrate 310 usable in a liquid crystal display device.

Like in embodiment 1, the liquid crystal display device includes a plurality of pixels arrayed in a matrix having a row direction and a column direction. The TFT substrate 310 includes a plurality of pixel regions corresponding to the plurality of pixels of the display device. The TFT substrate 310 includes a plurality of source bus lines 4 extending generally parallel to the column direction and a plurality of gate bus lines 2 extending generally parallel to the row direction.

As shown in FIG. 10, the pixel regions in the TFT substrate 310 each include the TFT 53 connected with the gate bus line 2 and the source bus line 4 and a pixel electrode (not shown). The pixel electrode is connected with the drain electrode 16 of the TFT 53 in a pixel contact hole CH formed in an insulating layer covering the TFT 53 (the insulating layer is, for example, the above-described passivation layer or an organic interlayer insulating layer).

As shown in FIG. 10, the gate electrode may be a part of the gate bus line 2. With this structure, a part of the gate bus line 2 that overlaps the oxide semiconductor layer 18 of the TFT 53 acts as the gate electrode. As shown in FIG. 10, the source electrode 14 may be a part of the source bus line 4. With this structure, a part of the source bus line 4 that contacts the oxide semiconductor layer 18 via the source-side contact hole acts as the source electrode 14. In this case, it is sufficient that the source bus line 4 is located so as to cover the source-side contact hole reaching the oxide semiconductor layer 18. The drain electrode 16 is provided so as to contact the oxide semiconductor layer 18 via the drain-side contact hole.

With this structure, the channel region and the contact regions of the TFT 53 are allowed to be located to be away from each other, and thus the level of the parasitic capacitances of the TFT 53 is made low. Since the oxide semiconductor layer 18 is typically transparent, the offset regions 18os and 18od are usable for display. Therefore, the light blocking region is made relatively small with respect to the area of the TFT 53, which further increases the aperture ratio.

The TFT substrates 300 and 310 in embodiment 3 according to the present invention are described above. Since the gate electrode 12 and the source/drain electrodes 14 and 16 are away from each other while the offset regions 18os and 18od of the oxide semiconductor layer 18 having a sufficiently low resistance is held between the gate electrode 12 and the source/drain electrodes 14 and 16. Therefore, the level of the parasitic capacitances is decreased while the on/off ratio is increased. When the TFT substrate 300 or 310 is used for a liquid crystal display device, the aperture ratio is increased and the pixel voltage is suppressed from being decreased by the field through voltage.

In this embodiment, the gate facing region 18g is covered with the gate electrode 12, and thus the carrier concentration of the gate facing region 18g is not easily changed by, for example, the process of forming the interlayer insulating layer 22'. This provides an advantage that the carrier concentration of the gate facing region 18g is easily controlled appropriately.

The TFT substrates in embodiments 1 through 3 are described above. A liquid crystal display device may be produced by use of such a TFT substrate with a known structure and a known method. Such a liquid crystal display device includes the TFT substrate described in any of embodiments 1 through 3, a counter substrate (e.g., glass substrate) and a liquid crystal layer held between the TFT substrate and the counter substrate.

In the case where the liquid crystal display device is of a VA mode or a TN mode, a counter electrode is formed on a surface of the counter substrate that faces the liquid crystal layer, and a voltage is applied to an area of the liquid crystal layer that is between the pixel electrode of the TFT substrate and the counter electrode. An alignment film (e.g., vertical alignment film) may be formed when necessary on a surface of the pixel electrode and a surface of the counter electrode that face the liquid crystal layer.

The liquid crystal display device is not limited to being of a vertical alignment mode (VA mode) described above. The liquid crystal display device may be of, for example, a transverse electric field mode such as an IPS mode, an FFS mode or the like, in which the pixel electrode and the counter electrode are provided on the TFT substrate. The structures of the ISP mode and the FFS mode are well known, and thus will not be described herein.

The TFT substrate described in each of embodiments 1 through 3 is described above as being used for a liquid crystal display device as an example. The TFT substrate may be used for another type of display device, for example, an organic electroluminescence (EL) display device, an inorganic electroluminescence display device, an MEMS display device or the like.

INDUSTRIAL APPLICABILITY

A semiconductor device in an embodiment according to the present invention is widely applicable to a device including a thin film transistor, for example, a circuit board of an active matrix substrate or the like, a display device such as a liquid crystal display device, an organic electroluminescence (EL) display device, an inorganic electroluminescence display device or the like, an image capturing device such as an image sensor or the like, an electronic device such as an image input device, a fingerprint reading device or the like.

REFERENCE SIGNS LIST

2 Gate bus line
4 Source bus line
5 TFT
10 Insulating substrate
12 Gate electrode
14 Source electrode
16 Drain electrode
18 Oxide semiconductor layer
18g Gate facing region
18os Source-side offset region
18od Drain-side offset region
18s Source connecting region
18d Drain connecting region
19 Pixel electrode
20 Gate insulating layer
22 Passivation layer
22' Interlayer insulating layer
24 Etch stop layer

The invention claimed is:

1. A semiconductor device, comprising:
a substrate; and
a thin film transistor provided on the substrate, the thin film transistor including a gate electrode, a gate insulating layer in contact with the gate electrode, an oxide semiconductor layer located so as to partially overlap the gate electrode with the gate insulating layer being located between the oxide semiconductor layer and the gate electrode, and a source electrode and a drain electrode electrically connected with the oxide semiconductor layer;
wherein:
the source electrode and the drain electrode are located to be away from the gate electrode as seen in a direction normal to the substrate;
the oxide semiconductor layer includes:
a gate facing region overlapping the gate electrode as seen in the direction normal to the substrate; and
at least one offset region provided adjacent to the gate facing region, the at least one offset region not overlapping the gate electrode, the source electrode or the drain electrode as seen in the direction normal to the substrate;
the gate facing region has a carrier concentration in a range of $1\times10^{17}/cm^3$ or greater and $1\times10^{19}/cm^3$ or less; and
the thin film transistor is of a depression type.

2. The semiconductor device according to claim 1, wherein the at least one offset region has a carrier concentration of $1\times10^{17}/cm^3$ or greater.

3. The semiconductor device according to claim 1, comprising a source connecting region and a drain connecting region provided adjacent to the offset region and in contact with the source electrode and the drain electrode;
wherein:
the source connecting region and the drain connecting region each have a carrier concentration of $1\times10^{17}/cm^3$ or greater.

4. The semiconductor device according to claim 1, wherein the at least one offset region has a carrier concentration higher than the carrier concentration of the gate facing region.

5. The semiconductor device according to claim 1, wherein the gate electrode is provided as a lower layer with respect to the oxide semiconductor layer with the gate insulating layer being located between the gate electrode and the oxide semiconductor layer.

6. The semiconductor device according to claim 1, further comprising an etch stop layer provided as an upper layer with respect to the oxide semiconductor layer so as to at least partially overlap the gate facing region of the oxide semiconductor layer.

7. The semiconductor device according to claim 1, wherein the gate electrode is provided as an upper layer with respect to the oxide semiconductor layer with the gate insulating layer being located between the gate electrode and the oxide semiconductor layer.

8. The semiconductor device according to claim 1, comprising a plurality of pixel regions arrayed in a matrix having a row direction and a column direction, a plurality of gate bus lines each extending generally parallel to the row direction, and a plurality of source bus lines each extending generally parallel to the column direction; the pixel regions, the gate bus lines and the source bus lines being provided on the substrate;
wherein:
the plurality of pixel regions each include:
the thin film transistor; and
a pixel electrode connected with the thin film transistor; and
the at least one offset region of the oxide semiconductor layer extends from the source electrode included in the source bus line to the gate bus line, and the drain electrode is located on a side opposite to the source electrode with the gate bus line being located between the drain electrode and the source electrode.

9. The semiconductor device according to claim 1, wherein the oxide semiconductor layer contains at least one metal element among In, Ga and Zn.

10. The semiconductor device according to claim 9, wherein the oxide semiconductor layer includes a crystalline portion.

11. A method for producing a semiconductor device, comprising:
- a step of preparing a substrate; and
- a step of forming a depression type thin film transistor on the substrate, the step of forming a thin film transistor including a step of forming a gate electrode, a step of forming a gate insulating layer in contact with the gate electrode, a step of forming an oxide semiconductor layer so as to partially overlap the gate electrode with the gate insulating layer being located between the oxide semiconductor layer and the gate electrode, and a step of forming a source electrode and a drain electrode electrically connected with the oxide semiconductor layer;
- wherein the step of forming the depression type thin film transistor further includes a step of, after forming the oxide semiconductor layer, changing a carrier concentration of the oxide semiconductor layer to adjust the carrier concentration of a gate facing region in the oxide semiconductor layer to be in a range of $1\times10^{17}/cm^3$ or greater and $1\times10^{19}/cm^3$ or less.

12. A semiconductor device, comprising:
- a substrate; and
- a thin film transistor provided on the substrate, the thin film transistor including a gate electrode, a gate insulating layer in contact with the gate electrode, an oxide semiconductor layer located so as to partially overlap the gate electrode with the gate insulating layer being located between the oxide semiconductor layer and the gate electrode, and a source electrode and a drain electrode electrically connected with the oxide semiconductor layer;

wherein:
- the source electrode and the drain electrode are located to be spaced away from the gate electrode as seen in a direction normal to the substrate;
- the oxide semiconductor layer includes:
  - a gate facing region overlapping the gate electrode as seen in the direction normal to the substrate; and
  - at least one offset region provided adjacent to the gate facing region, the at least one offset region not overlapping the gate electrode, the source electrode or the drain electrode as seen in the direction normal to the substrate; and
- the gate facing region has a carrier concentration in a range of $1\times10^{17}/cm^3$ or greater and $1\times10^{19}/cm^3$ or less; and
- a length of the offset region in a source-drain direction is 0.5 μm to 15 μm, and is less than or equal to 3 times a width of the gate facing region in a direction orthogonal to the source-drain direction.

13. The semiconductor device according to claim 12, wherein the thin film transistor is of a depression type.

* * * * *